(12) United States Patent
Sakai et al.

(10) Patent No.: US 7,387,903 B2
(45) Date of Patent: Jun. 17, 2008

(54) METHOD FOR MANUFACTURING LAYER PATTERN, METHOD FOR MANUFACTURING WIRING, AND METHOD FOR MANUFACTURING ELECTRONIC EQUIPMENT

(75) Inventors: Hirofumi Sakai, Suwa (JP); Kazuaki Sakurada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 304 days.

(21) Appl. No.: 10/887,822

(22) Filed: Jul. 12, 2004

(65) Prior Publication Data
US 2005/0042850 A1 Feb. 24, 2005

(30) Foreign Application Priority Data

| Jul. 15, 2003 | (JP) | ............................. 2003-274705 |
| Sep. 19, 2003 | (JP) | ............................. 2003-327997 |

(51) Int. Cl.
*H01L 21/00* (2006.01)
(52) U.S. Cl. .................. 438/21; 438/597; 438/618; 257/E21.588; 257/E21.464
(58) Field of Classification Search .................. 438/21, 438/597, 618
See application file for complete search history.

(56) References Cited

U.S. PATENT DOCUMENTS

| 6,610,552 | B2 | 8/2003 | Fujimori et al. |
| 6,727,513 | B2 | 4/2004 | Fujimori et al. |
| 2002/0060518 | A1* | 5/2002 | Duineveld et al. .......... 313/506 |
| 2004/0018748 | A1* | 1/2004 | Lu et al. ..................... 438/778 |
| 2005/0245079 | A1* | 11/2005 | Honda et al. ............... 438/676 |

FOREIGN PATENT DOCUMENTS

| JP | A 2000-216330 | 8/2000 |
| JP | 2002-23783 | * 8/2002 |
| JP | A-2002-237383 | 8/2002 |
| JP | A-2003-124210 | 4/2003 |
| JP | A-2003-163084 | 6/2003 |

* cited by examiner

*Primary Examiner*—Alexander G Ghyka
(74) *Attorney, Agent, or Firm*—Oliff & Berridge, PLC

(57) ABSTRACT

Aspects of the invention provide a manufacturing method enabling a fine layer pattern to form it precisely and stably. An exemplary method for manufacturing a layer pattern can include a step (a) of forming a region defined by a first layer and a second layer on a substrate and a step (b) of ejecting a liquid like material to the region from an ejecting part of an ejecting device. Here, the first layer can be formed on the substrate and the second layer can be located on the first layer. A lyophobicity of the first layer to the liquid like material is lower than the lyophobicity of the second layer to the liquid like material.

6 Claims, 15 Drawing Sheets

METHOD FOR MANUFACTURING LAYER PATTERN, METHOD FOR MANUFACTURING WIRING, AND METHOD FOR MANUFACTURING ELECTRONIC EQUIPMENT

BACKGROUND OF THE INVENTION

1. Field of Invention

The present invention relates to a method for manufacturing a layer pattern, particularly to the method for manufacturing the layer pattern that is suitable for manufacturing a wiring of electronic equipment.

2. Description of Related Art

The related art includes a method for manufacturing an electrical conductive wiring by using an inkjet technique. See, for example, Japanese Unexamined Patent Publication Application No. 2000-216330. According to the method, a molten solder material or silver paste is directly provided on a substrate as a pattern and then transformed into a film pattern from it by performing a heat treatment or a laser light irradiation.

SUMMARY OF THE INVENTION

Recently, circuits used in devices have advanced in high-density. In response to this, for example, a wiring becomes finer. In the method for manufacturing a film pattern by using the inkjet technique described above, an ejected liquid is spread over a substrate after its landing. This makes it difficult to form a fine film pattern stably. Especially, if a width of the pattern to be formed is smaller than a size of the liquid drop, it is extremely difficult to form the wiring.

An exemplary embodiment of the invention provides a manufacturing method that is capable of forming a fine film pattern precisely and stably.

A method for manufacturing a layer pattern can include a step a) of forming a region defined by a first layer and a second layer on a substrate. Here, the first layer is formed on the substrate and the second layer is located on the first layer. The method can also include a step b) of ejecting a liquid like member to the region from an ejecting part of an ejecting device. Lyophobicity of the first layer with respect to the liquid like member is lower than lyophobicity of the second layer with respect to the liquid like member.

The above-mentioned constructions can form a fine layer pattern precisely and stably. The reason is that the member ejected does not spread over the substrate unnecessarily, since the region where the liquid like member is to be ejected is partitioned by the first layer and the second layer.

In addition, since the second layer exhibits higher lyophobicity than that of the first layer, the liquid drop of a wiring material 111 that is just after landed on the partitioned region flows in the first layer, does not flow out of the region beyond the second layer. Accordingly, a liquid applying becomes more stable.

Preferably, the step a) can include a step c) of forming the first layer and the second layer such that the region includes a first part having a first width and a second part having a second width being narrower than the first width, and the step b) can include a step d) of ejecting the liquid like member only to the first part. More preferably, the first layer can have a lyophilicity with respect to the liquid like member.

Since the above-mentioned constructions enable the layer that is close to the substrate, namely the first layer, to have lyophilicity, the wiring material 111 landed on a wide width region 38A flows in the wide width region 38A and a narrow width region 38B even though the wiring material 111 is not ejected on both the wide width region 38A and the narrow width region 38B. The reason is that the first layer causes a capillary phenomenon.

The invention can be realized by various aspects of the invention. For example, a method for manufacturing a wiring or electronic equipment can be realized.

BRIEF DESCRIPTION OF THE DRAWINGS

The invention will be described with reference to the accompanying drawings, wherein like numerals reference like elements, and wherein:

FIGS. 8(a) through (e) are sectional views taking along line A-A' in FIG. 8(f);

FIGS. 11 (a) through (e) are sectional views taking along line B-B' in FIG. 11(f);

DETAILED DESCRIPTION OF PREFERRED EMBODIMENTS

Exemplary embodiments of the invention will now be described with reference to the accompanying drawings while taking an application for a method for manufacturing a plasma display device, a liquid crystal display device, and an electroluminescence display device for examples as below. It should be understood that the exemplary embodiments described as below do not limit the invention described in claims. Also, all of constructions described in the embodiments are not an essential in order to solve problems of the invention.

A method for manufacturing the plasma display device according to a first exemplary embodiment of the invention will be described.

Figure 1A:
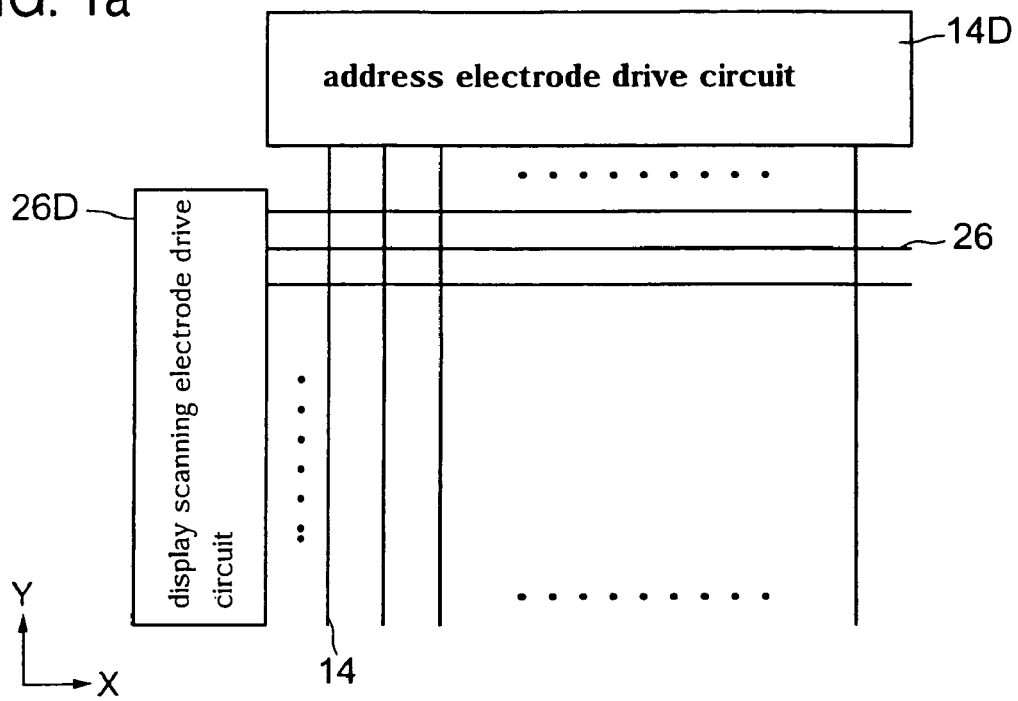
FIG. 1(a) is a diagram schematically illustrating a wiring of a plasma display device and FIG. 1(b) is a diagram schematically illustrating an address electrode according to a first embodiment of the invention.

The plasma display device can include a plurality of address electrodes 14 each extending to Y axis direction, an address electrode drive circuit 14D applying a signal to the plurality of address electrodes 14, a plurality of display scanning electrodes 26 each extending to X axis direction, and a display scanning electrode drive circuit 26D applying a signal to the plurality of display scanning electrodes 26, as shown in FIG. 1(a). The X axis direction and the Y axis direction described here are perpendicular to each other and are the same direction in which a nozzle of an ejecting device described later relatively moves with respect to a stage.

The plurality of address electrodes 14 are formed to a back substrate of the plasma display device. The display scanning electrodes 26 are formed to a front substrate of the plasma display device. While the plasma display device 10 include a plurality of display electrodes formed on the front substrate, they are omitted in FIG. 1 in order to simplify a description. The back substrate, front substrate, and the plurality of display electrodes will be described in greater detail below.

Figure 1B:
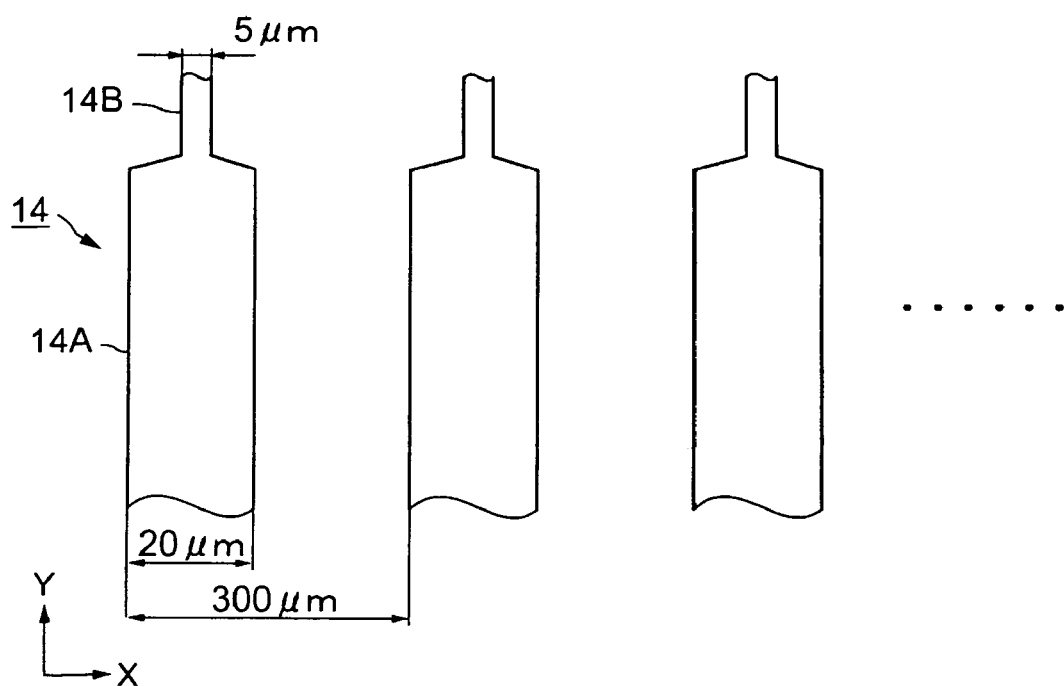

As shown in FIG. 1(b), a distance between the address electrodes 14 is approximately 300 μm. Also, each of the address electrodes 14 includes a wide width part 14A and a narrow width part 14B. The width of the wide width part 14A is approximately 20 μm. The width of the narrow width part 14B is approximately 5 μm.

In this embodiment, each of the plurality of address electrodes 14 connects the address electrode drive circuit 14D with the narrow width part 14B. As described later, the address electrodes 14 are formed on a part to be ejected 18 (FIG. 18) provided to a base body by ejecting a liquid like wiring material from the ejecting device such as an inkjet device.

The address electrodes 14 of this embodiment are an example of a layer pattern or a wiring according to the invention.

Figure 2:
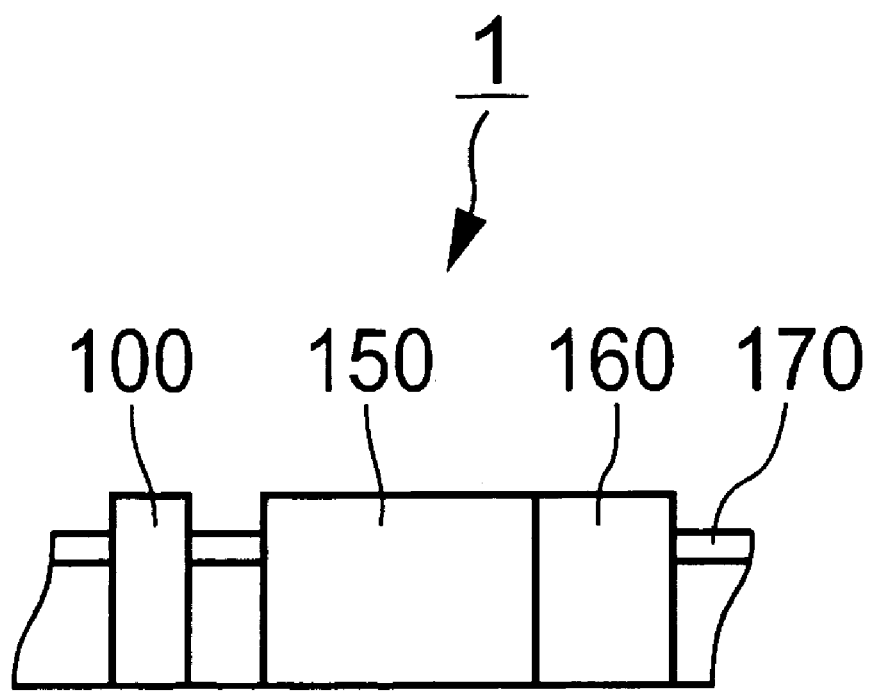
FIG. 2 is a diagram schematically illustrating a manufacturing device according to the first embodiment of the invention.

A manufacturing device 1 shown in FIG. 2 is the device forming the wiring on the part to be ejected 18 (FIG. 8) of the base body. Specifically, the manufacturing device 1 includes an ejecting device 100 applying a liquid like wiring material 111 to all of the parts to be ejected 18, a drying device drying the wiring material 111 on the part to be ejected 18, and an oven 160 reheating (post-baking) the wiring material 111. Additionally, the manufacturing device 1 includes a transferring device 170 transferring the base body in the following order: the ejecting device 100, the drying device 150, and the oven 160.

Figure 3:
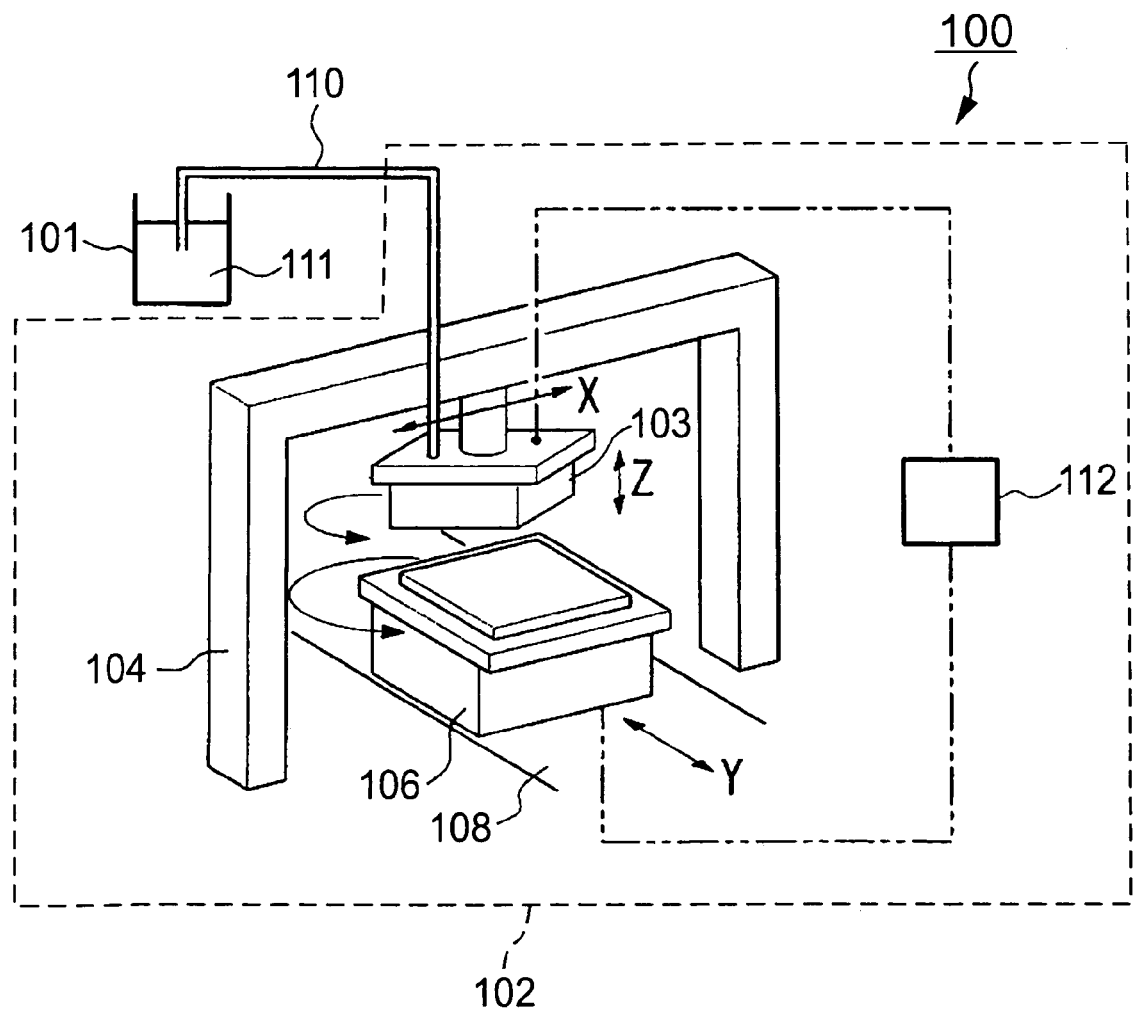
FIG. 3 is a diagram schematically illustrating an ejecting device according to the first embodiment of the invention.

As shown in FIG. 3, the ejecting device 100 can include a tank 101 storing the liquid like wiring material 111 and an ejecting scanning part 102 into which the wiring material 111 is supplied from the tank 101 through a tube 110. The ejecting scanning part 102 includes a carriage 103 having a plurality of heads 114 (FIG. 4) each enabling the liquid like wiring material to eject, a first position control device 104 controlling a position of the carriage 103, a stage 106 holding a supporting substrate 12, a second position control device 108 controlling a position of the stage 106, and a controlling part 112. The tank 101 connects the plurality of heads of the carriage 103 through the tube 110. The liquid like wiring material is supplied to each of the plurality of the heads 114 by a compressed air from the tank.

The liquid like wiring material 111 in this embodiment is an example of a liquid like wiring member according to the invention. The liquid like material means the material having a viscosity that enables the ejection from the nozzle. In this case, whether the material is an aqueous or an oily is not concerned. Thus, it is enough that if it has a free flowing (the viscosity) enabling the ejection from the nozzle. If the material still maintains the free flowing as a whole even though a solid material is mixed in it, it is enough.

The first position control device 104 is equipped with a linear motor, thereby transferring the carriage 103 along to the X-axis direction, and the Z-axis direction being perpendicular to the X-axis direction in response to a signal from the control part 112. The second position control device 108 is equipped with the linear motor, thereby transferring the stage 106 along to, and the Y-axis direction being perpendicular to both the X-axis direction and the Z-axis direction in response to the signal from the control part 112. The stage 106 has a plane being parallel to both the X-axis direction and the Y-axis direction, constructed so as to fix a base body 10A (FIG. 8) on this plane. Since the stage 106 fixes the base body 10A, the stage 106 can define a position of a part to be ejected 18, 18A, and 18B. The base body 10A in this embodiment is an example of an accommodated substrate.

The first position control device 104 additionally includes a function of rotating the carriage 103 around a prescribed axis being parallel to the Z-axis direction. The Z-axis direction means the direction being parallel to the vertical direction (namely, the direction of the gravity acceleration). With the rotation of the carriage 103 around the axis being parallel to the Z-axis direction by the first position control device 104, the X-axis and the Y-axis of a coordination system on the accommodated substrate can be aligned so as to being parallel to the X-axis direction and the Y-axis direction respectively. In this embodiment, both the X-axis direction and the Y-axis direction are the direction in which the carriage moves with respect to the stage 106. The first position control device 104 and the second position control device 108 may be described as a scanning part in this specification.

The carriage 103 and the stage 106 additionally have a freedom of a parallel movement and a rotation other than that as described above. In this embodiment, however, a description regarding a freedom other than those as abovementioned is omitted in order to simplify the explanation.

The control part 112 is adapted so as to receive an ejecting data representing a relative position where the wiring material is to be ejected. Detailed functions of the control part 112 will be described in greater detail below.

Figure 4:
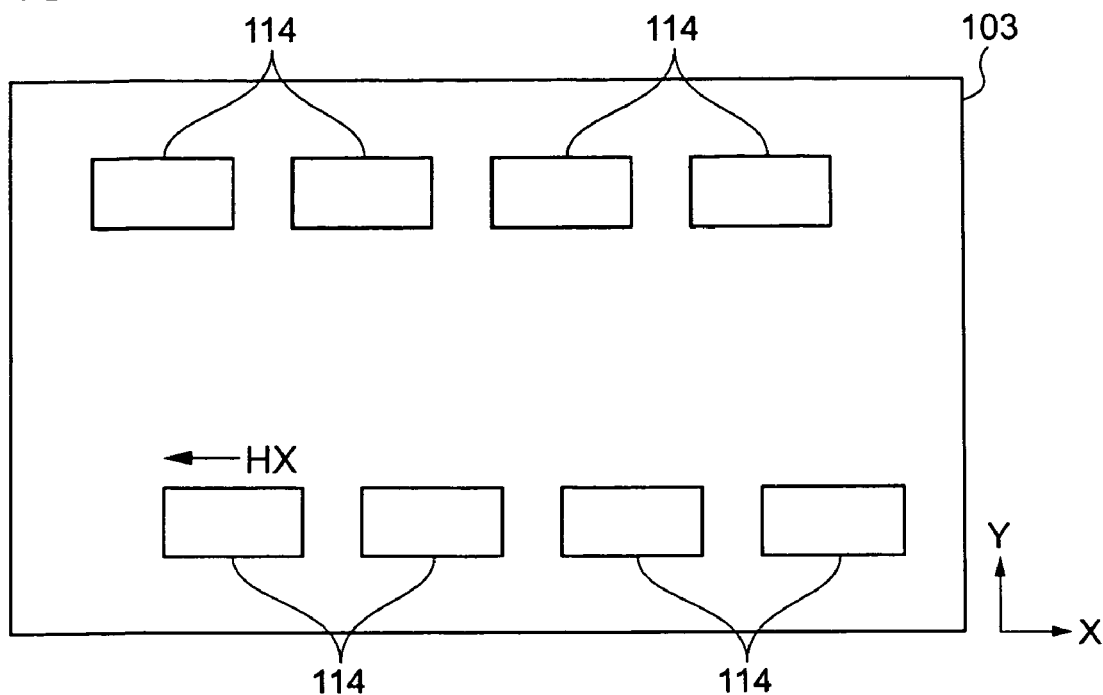
FIG. 4 is a diagram schematically illustrating a carriage according to the first embodiment of the invention.

The carriage 103, as shown in FIG. 4, includes the plurality of heads 114 each having the same construction. Here, FIG. 4 is a diagram illustrating the carriage 103 observed from the stage 106 side. Thus, the Z-axis direction is perpendicular to the FIG. 4. In this embodiment, the carriage 103 arrays two rows each having four pieces of the heads 114. Each of the heads 114 is fixed to the carriage 103 so as to make an angle AN of zero degree between a longitudinal direction of the carriage 103 and the X-axis direction. However, the angle AN is variable as described in another embodiment of the invention below.

Figure 5:
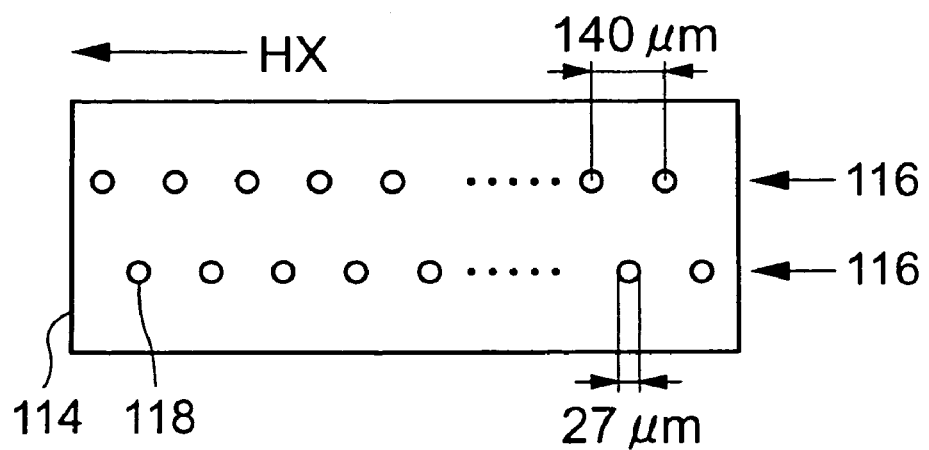
FIG. 5 is a diagram schematically illustrating a head according to the first embodiment of the invention.

As shown in FIG. 5, at least one of the heads 114 for ejecting the wiring material 111 includes two lines of a nozzle row extending along the longitudinal direction of the head 114. The nozzle row 116 includes 180 pieces of a nozzle 118 arrayed in a line. The direction of the nozzle row 116 is represented as a nozzle row direction HX. A distance between the nozzles 118 along the nozzle row direction HX is approximately 140 μm. Also, in FIG. 5, two lines of the nozzle row 116 of the head 114 are shifted from each other by half pitch (approximately 70 μm). A diameter of the nozzle 118 is approximately 27 μm. Since the angle AN is the angle between the longitudinal direction of the head 114 and the X-axis direction as above-mentioned, an angle between the nozzle row direction HX, namely the direction in which 180 pieces of the nozzle are arrayed, and the X-axis direction is also the angle AN. Each end part of the plurality of the nozzles 118 is located on a virtual plane defined by the X-axis direction and the Y-axis direction as described above. In addition, a shape of the each nozzle 118 is adjusted such that the head 114 can eject the material approximately parallel to the Z-axis.

Figure 6A:
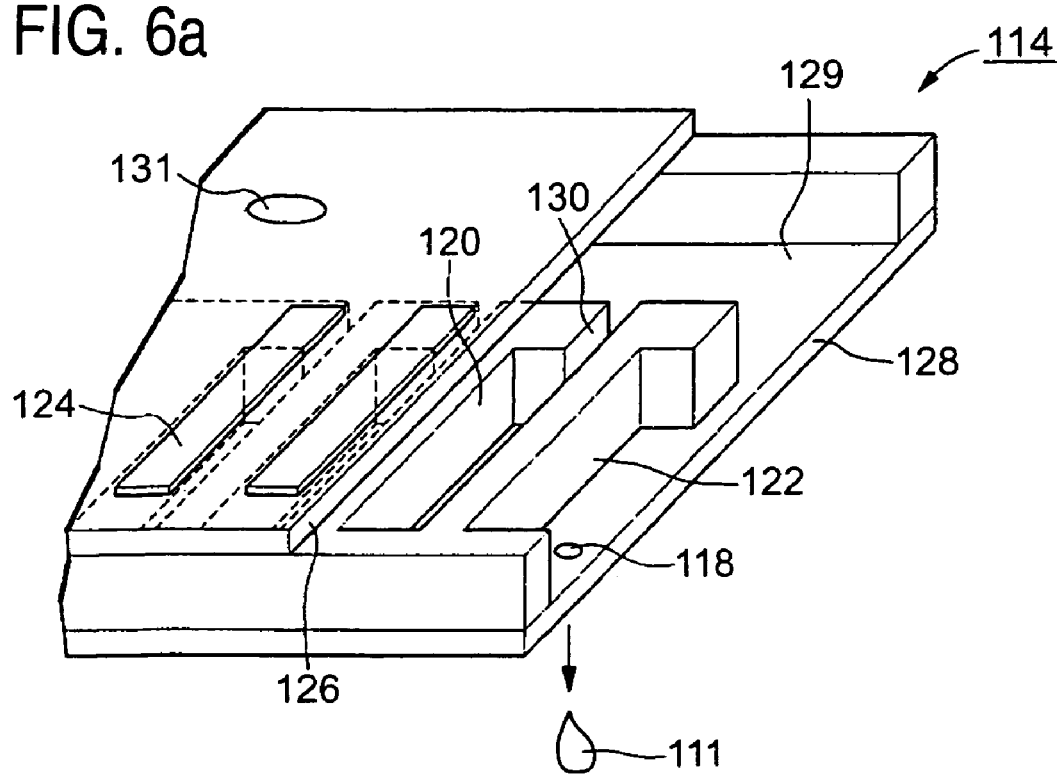
FIG. 6(a) and (b) are diagrams schematically illustrating an ejecting part of the head of FIG. 5.
Figure 6B:
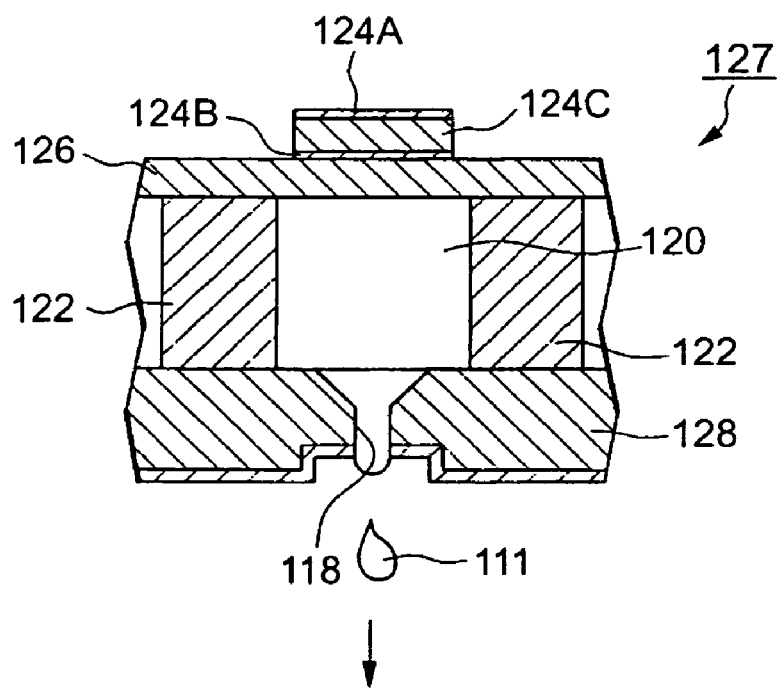

As shown in FIG. 6(a) and 6(b), the each head 114 is an inkjet head. More specifically, the each head 114 can include a vibration plate 126, a nozzle plate 128. A liquid reservoir 129 is formed between the vibration plate 126 and the nozzle plate 128. The liquid reservoir 129 is always filled with the liquid like wiring material 111 supplied from a tank 101 through a hole 131. Also, a plurality of partitions 122 are allocated between the vibration plate 126 and the nozzle plate 128. A part surrounded by the vibration plate 126, the nozzle plate 128, and a pair of the partitions forms a cavity 120. Since the cavity 120 is allocated in corresponding to the nozzle 118, a number of the cavity 120 is the same as that of the nozzle 118. The wiring material 111 is supplied to the cavity 120 from the liquid reservoir 129 through a supply inlet 130 located between the pair of the partitions 122.

On the vibration plate 126, a vibrator 124 is disposed adjacent to the each cavity 120. The vibrator 124 can include a piezoelectric element 124C and a pair of electrodes 124A and 124B sandwiching the piezoelectric element 124C. Applying a drive voltage to the pair of electrode 124A and 124B, the liquid like wiring material 111 is ejected from the corresponding nozzle 118.

The control part 112 (FIG. 3) is adapted so as to apply a mutually independent signal to each of the plurality of vibrators 124. Therefore, a volume of the wiring material ejected from the each nozzle 118 is controlled by a signal from the control part 112 with respect to the each nozzle 118. Additionally, the volume of the wiring material ejected from the each nozzle 118 is variable from zero pl (picolitter) to 42 pl. Accordingly, the nozzle 118 may be set so as to perform an ejection or not perform the ejection during an apply scanning.

In this specification, a part includes one nozzle 118, the cavity 120 in corresponding to the nozzle 118, and the vibrator 124 in corresponding to the cavity may be described as an ejecting part 127. According to this description, one head 114 includes the ejecting part 127 being the same number as that of the nozzle 118. As above-mentioned, in this embodiment, the carriage 103 includes the heads 114. On the other hand, each of the heads 114 includes the plurality of the ejecting part 127. Therefore, in this speci-fication, it may be described that the carriage 103 includes the plurality of the ejecting parts 127.

The ejecting parts 127 may include an electrical thermal converting element instead of the piezoelectric element. Thus, the ejecting parts 127 may be adapted so as to eject the material by using a thermal expansion of a material of the electrical thermal converting element.

As above-mentioned, the carriage 103 is moved to the X-axis direction and the Z-axis direction by the first position control device 104 (FIG. 3). On the other hand, the stage 106 (FIG. 3) is moved to the Y-axis direction by the second position control device 108 (FIG. 3). As a result, the carriage 103 moves relatively to the stage 106 by the first position control device 104 and the second position control device 108. Specifically, the plurality of the heads 114, the plurality of the nozzle rows 116, or the plurality of the nozzles 118 move relatively to the X-axis direction and the Y-axis direction, while keeping a prescribed distance in the Z-axis direction with respect to the part to be ejected 18 positioned on the stage 106, namely relatively scan. More specifically, the heads 114 eject the material while relatively scanning in the X-axis direction and the Y-axis direction with respect to the stage.

In this embodiment, the nozzle 118 may eject the material to the part to be ejected 18 by scanning the nozzle 118 in Y-axis direction with respect to the part to be ejected 18. A relative scanning can include the scanning that at least one of an ejecting side or a side on which the ejection lands (the part to be ejected 18 side) scans with respect to the other. A combination of the relative scanning and the ejecting of the material may be described as an applying scanning.

Next, a construction of the control part 112 will be described. As shown in a function block diagram of FIG. 7, the control part 112 includes an input buffer memory 200, a storage 202, a processing part 204, a scanning driver 206, and a head driver 208. The buffer memory 202 and the processing part 204 are connected so as to able to communicate with each other. The processing part 204 and the storage means 202 are connected so as to able to communicate with each other. The processing part 204 and the scanning driver 206 are connected so as to able to communicate with each other. The processing part 204 and the head driver 208 are connected so as to able to communicate with each other. Also, the scanning driver 206 connects the first position control device 104 and the second position control device 108 so as to able to communicate with each other. Similarly, the head driver 208 and each of the plurality of heads 114 are connected so as to able to communicate with each other.

Figure 7:
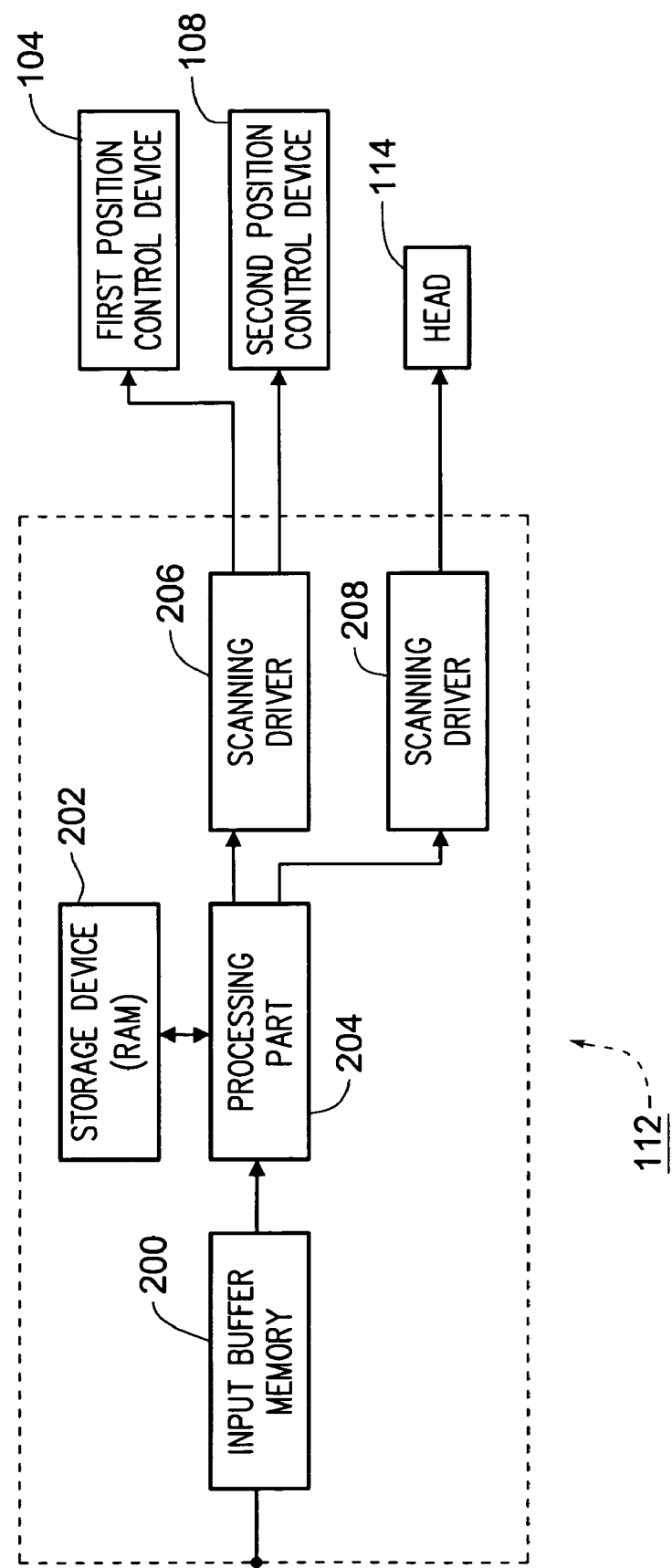
FIG. 7 is a diagram illustrating a function block diagram of a control part of the ejecting device.

The input buffer memory 200 receives an ejecting date for ejection of the wiring material 111 from an outside information-processing device. The ejecting data includes as follows: a data representing all relative positions of the part to be ejected 18 on the base body 10A, a data representing a number of the relative scanning required in order to apply the wiring material 111 to all the parts to be ejected 18 until a prescribed thickness is achieved, a data representing a landing position on the part to be ejected, a data designating the nozzle 118 performing the ejection, and a data designating the nozzle 118 that does not perform the ejection. The input buffer memory 200 supplies the ejecting data to the processing part 204. The processing part 204 stores the ejecting data into the storage 202. In FIG. 7, the storage is RAM.

The processing part 204 supplies the data representing the relative position of the nozzle row 116 with respect to the part to be ejected 18 to the scanning driver 206 based on the ejecting data in the storage 202. The scanning driver 206 applies the drive signal in accordance with the data to the first position control device 104 and the second position control device 108. As a result, the nozzle row 116 is scanned with respect to the part to be ejected 18. On the other hand, the processing part 204 supplies the data representing an ejecting timing from the corresponding nozzle 118 to the head driver 208 based on the ejecting data stored in the storage 202. The head driver 208 applies the drive signal required in order to eject the wiring material 111 to the heads 114 based on the data. As a result, the liquid like wiring material 111 is ejected from the corresponding nozzle 118 of the nozzle 116.

The control part may be a computer includes at least CPU, ROM, and RAM. In this case, a software program executed by the computer achieves the above-mentioned functions of the control part 112. Alternatively, the control part 112 may be achieved by an exclusive circuit (hardware).

The above-mentioned constructions being provided, an ejecting device 100 carries out the applying scanning of the wiring material 111 in accordance with the data supplied by the control part 112.

Figure 8A:
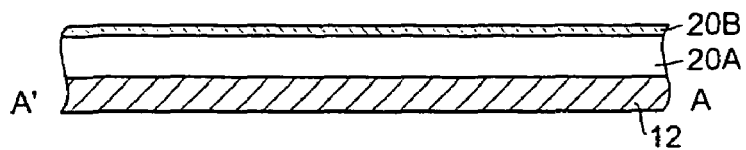
FIGS. 8(a) through (h) are diagrams schematically illustrating a method for manufacturing the address electrode according to the first embodiment of the invention.

Next, a method for manufacturing the address electrodes 14 will be described. At the first, the supporting substrate 12 such as a glass substrate is subjected to an UV (ultraviolet) cleaning. Then, as shown in FIG. 8(a), an acrylic-type thermosetting resin in which a black pigment is dispersed (namely resin black) is applied on one surface of the supporting substrate at thickness of approximately 2 μm so as to cover its whole surface by using a spin coating method. Accordingly, a resin black layer 20A forms on the supporting substrate 12. Subsequently, a negative-type acrylic-type chemically amplified photosensitive resist blended with a fluoric-type polymer is applied on the resin black layer 20A so as to cover its whole surface, thereby forming a resist layer 20B on the resin black layer 20A.

Figure 8B:
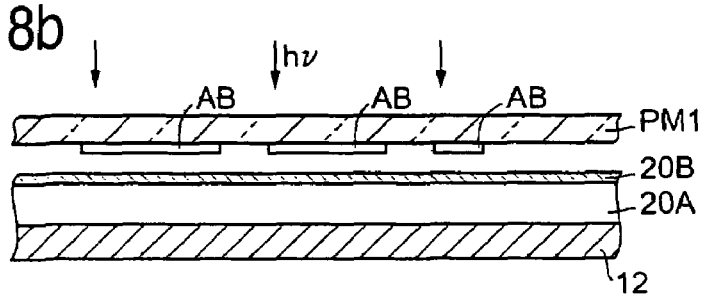
Figure 8C:
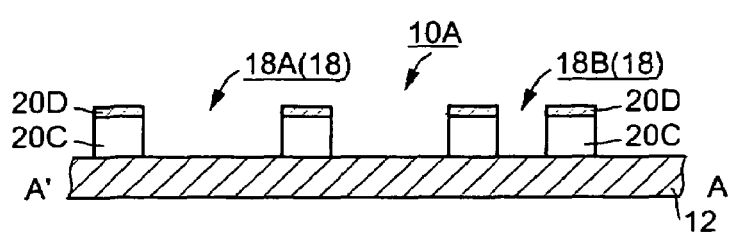

Next, the resist layer 20B and the resin black layer 20A are subjected to patterning. Specifically, as shown in FIG. 8(b), a photo mask PM1 having a light-shielding part AB at a part corresponding to a region where the address electrode is formed being provided, the resist layer 20B is irradiated by light hv. Then, by performing an etching using a prescribed etchant, a plurality of parts where the light hv has not been irradiated, namely a plurality of parts of the resist layer 20B corresponding to a plurality of address electrodes 14, and a resin black layer 20A are removed. Accordingly, the resin black layer 20C and a resist layer 20D having a shape surrounding the address electrode 14 that is to be formed later are formed on the supporting substrate 12.

In this way, by forming the resin black layer 20C located on the supporting substrate 12 and the resist layer located on the resin black layer 20C, a region defined by the resin black layer 20C and the resist layer 20D (namely, the part to be ejected 18) is formed on the supporting substrate 12.

In this embodiment, the resin black layer 20C can correspond to a first layer, and the resist layer 20D corresponds to a second layer in the invention.

In this specification, the resin black layer 20C having the above-mentioned shape and the resist layer 20D located on the resin black layer 20C being conbined, it may be described as a bank 20. According to this description, by forming the back 20 including the resin black layer 20C and the resist layer 20D, a region defined by the bank 20, namely the part to be ejected 18, forms on the supporting substrate 12. In this embodiment, the bank is the term including a partition, a cross wall or the like.

Figure 8F:
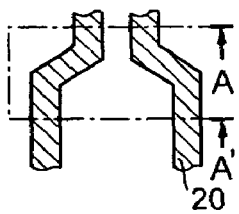

As shown in FIG. 8(f), the part to be ejected 18 has a nearly same shape as that of at least one of the address electrodes 14. Therefore, the part to be ejected 18 includes a wide width region 18A corresponding to the wide width part 14A of the address electrode 14, and a narrow width region 18B corresponding to the narrow width part 14B of the address electrode 14. The width of the wide width region 18A is approximately 20 μm. The width of the narrow width region 18B is approximately 5 μm. In this embodiment, the supporting substrate 12 and the part to be ejected 18 formed on the supporting substrate 12 being combined, it may be described as a base body 10A.

Next, by fixing the base body 10A on the stage 106 of the ejecting device 100 of the manufacturing device 1, the part to be ejected 18 is positioned on the stage 106. In this case, the base body 10A is fixed on the stage 106 such that a longitudinal direction of the part to be ejected 18 is parallel to the Y-axis direction. At least one of the carriage 103 and the stage 106 is moved such that the X-coordinate of the nozzle 108 is identical to the X-coordinate of the part to be ejected 18. In this case, it is preferable that the angle AN between the nozzle row direction HX and the X-axis direction is set such that each X-coordinate of the plurality of nozzles 118 simultaneously coincides with each X-coordinate of the plurality of parts to be ejected 18. By doing this, the applying scanning for the plurality of parts to be ejected 18 can carry out simultaneously during one scanning period.

Figure 8D:
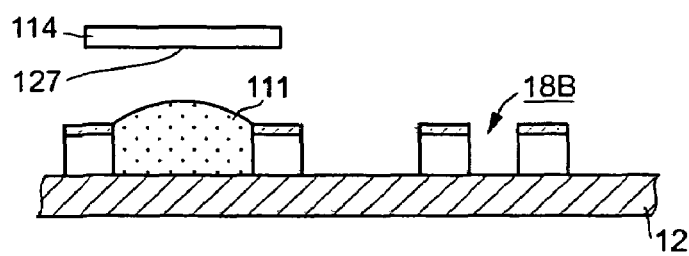
Figure 8G:
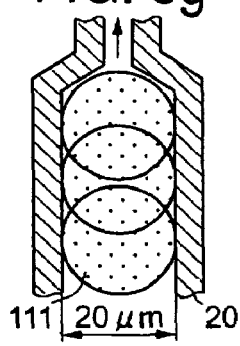
Figure 8E:
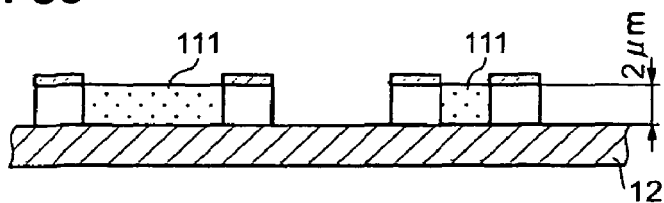
Figure 8H:
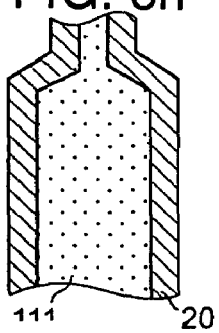

As shown in FIG. 8(d) and (g), the ejecting device 100 ejects the liquid like wiring material 111 to the part to be ejected 18 from the corresponding nozzle 118 during one scanning period. In this case, as shown in FIG. 8(d) and (g), the ejecting device 100 ejects the liquid like wiring material 111 to only the wide width region 18A of the part to be ejected 18 at a prescribed interval. If a liquid drop of the wiring material that is just after ejected from the nozzle 18 is projected on the plane defined by the X-axis direction and the Y-axis direction, a radius of the projected liquid drop may be approximately 20 μm. That is to say, the radius of the liquid drop is nearly same as the width of the wide width region 18A.

In this exemplary embodiment, the scanning period means the period in which one side of the carriage 103 carries out one relative movement along the Y-axis direction from one end (or the other end) to the other end (or one end) of a scanning area. Also, in this embodiment, the scanning area means the area where the one side of the carriage 103 carries out the relative movement until when the carriage 103 completes applying the wiring material 111 to all of the plurality of parts to be ejected 18. However, in some cases, the scanning area may mean as follows: an area where one nozzle 118 carries out the relative movement, or an area where one nozzle row 116 carries out the relative movement, or an area where one head 114 carries out the relative movement. The relative movement of the carriage 103, the head 114, and the nozzle 118 means that their relative positions with respect to the part to be ejected 18 vary. Therefore, even if only the part to be ejected 18 is moved by the stage 106 while absolutely resting of the carriage 103, the head 114, or the nozzle 118, it is described that the carriage 103, the head 114, or the nozzle 118 carry out the relative movement.

The liquid like wiring material 111 is the dispersion that conductive fine particles are dispersed into a dispersion medium. For the conductive fine particles, for example, a metal fine particles including at least any of gold, silver, cupper, palladium, and nickel, their oxides, and fine particles of a conductive polymer or a super-conductive material or the like are employed.

Those conductive fine particles may be used with a coating of an organic material on the surface in order to improve a dispersion performance. For the coating material coated on the surface of the conductive fine particles, for example, an organic solvent such as xylene, toluene, or the like and citric acid or the like are exemplified.

A particle diameter of the conductive fine particles is preferably 1 nm and above and 0.1 μm and below. If larger than 0.1 μm, a case where the nozzle 118 gets clogged may occur. If smaller than 1 nm, a volume ratio of the coating material to the conductive fine particles becomes large, thereby excessively increasing a ratio of the inorganic material in the film. As a result, a conductivity deteriorates.

Any dispersion medium that is capable of dispersing the above-mentioned conductive particles and does not cause an aggregation can be used. For example, other than water, alcohols such as methanol, ethanol, propanol, butanol, or the like, a hydro-carbon compounds such as n-heptane, n-octane, decane, dodecane, tetradecane, toluene, xylene, cymene, durene, indene, dipentene, tetrahydronaphthalene, decahydronaphthalene, cyclohexylbenzene or the like, an ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethyl) ether, p-dioxane, or the like, and a polar compounds such as propylene carbonate, gamma-butyrolactone, N-methyl-2-pyrrolidone, dimethylformamide, dimethyl sulfoxide, cyclohexanone, or the like are exemplified. Water, the alcohols, the carbon hydride series compounds, and the ether series compounds are preferable for the dispersion medium, water and the carbon hydride series compounds are much preferred from the following points of view: a dispersion of the fine particles, a stability of the dispersion, an ease of the application for the liquid drops ejecting method (inkjet method).

In this embodiment, the resist layer 20D exhibits a lyophobicity to the liquid like wiring material. In addition, the lyophobicity of the resin black layer 20C to the wiring material 111 is lower than that of the resist layer 20D to the wiring material 111. The resin black layer 20C exhibits a lyophilicity rather than the lyophobicity to the wiring material 111. These reasons are that the resist layer 20D is blended with the fluoric-type polymer and the resin black layer 20C does not include the fluoric-type polymer. In general, a surface of the resin including fluorine exhibits higher lyophobicity to the wiring material including the above-mentioned dispersion medium than that of the surface of the resin including no fluorine. On the other hand, many resins including no fluorine exhibit the lyophilicity to the above-mentioned liquid like wiring material.

Since the resist layer 20D exhibits relatively high lyophobicity, the liquid drop that just after landed on the part to be ejected 18 flows down to the resin black layer 20C, does not flows out of the part to be ejected 18 beyond the resist layer 20D. Additionally, since a layer being close to the supporting substrate 12, namely the resin black layer 20C, exhibits the lyophilicity, the wiring material landed on the wide width region 18A flows in the narrow width region 18B, even though the wiring material 111 is not ejected to the wide width region 18A. The reason is that the resin black layer 20C causes capillary phenomenon. In addition, since the bank 20 is made up of a layer exhibiting a desired lyophobicity and a layer exhibiting a desired lyophilicity, a surface treatment process in order to make the bank exhibit the lyophobicity or lyophilicity is not required. For example, a plasma treatment using tetrafluoromethane as a treatment gas or an oxygen plasma treatment is not required.

In this embodiment, the negative-type acrylic-type chemically amplified photosensitive resist blended with a fluoric-type polymer is used as the material for the layer exhibiting the lyophobicity to the liquid like material. □ photosensitive performance is not limited to the negative-type, a positive-type may be applicable. Also, in this embodiment, the acrylic-type thermosetting resin in which a black pigment is dispersed (namely resin black) is used as the material for the layer exhibiting the lyophilicity to the liquid like material. However, other than the resin black, a photosensitive polyimide, an acrylic-type resist, and an epoxy-type resist can be used as the layer exhibiting the lyophilicity.

Depending on a characteristic of the dispersion medium, a material including no fluoric-type polymer may exhibit the lyophobicity to the wiring material 111 rather than a material including fluoric-type polymer. In this case, the material can be chosen so as to obtain a desired lyophobicity and lyophilicity according to the dispersion medium included in the wiring material.

As shown in FIG. 8(*e*) and (*h*), the layer of the wiring material is applied not only to the wide width region 18A but also to the narrow width region 18B by the above-mentioned ejecting method.

If the layer of the wiring material 111 has been formed on all the parts to be ejected 18 of the base body 10A, the transferring device 170 sets the base body 10A in the drying device 150. Then, the address electrodes 14 are achieved on the part to be ejected 18 by completely drying the wiring material 111 on the part to be ejected 18. Subsequently, the transferring device 170 sets the supporting substrate 12 in the oven 160. Then, the oven 160 reheats (post-baking) the plurality of address electrodes 14. A thickness of both the wide width part 14A and the narrow width part 14B after the reheating are approximately 2 μm.

The plurality of address electrodes 14 are formed on the supporting substrate 12 by the above-mentioned processes. Subsequently, a plasma display device 10 shown in FIG. 9 is achieved from the base body 10A on which the address electrodes 14 are formed by utilizing a known thin film forming processes and patterning processes.

Figure 9:
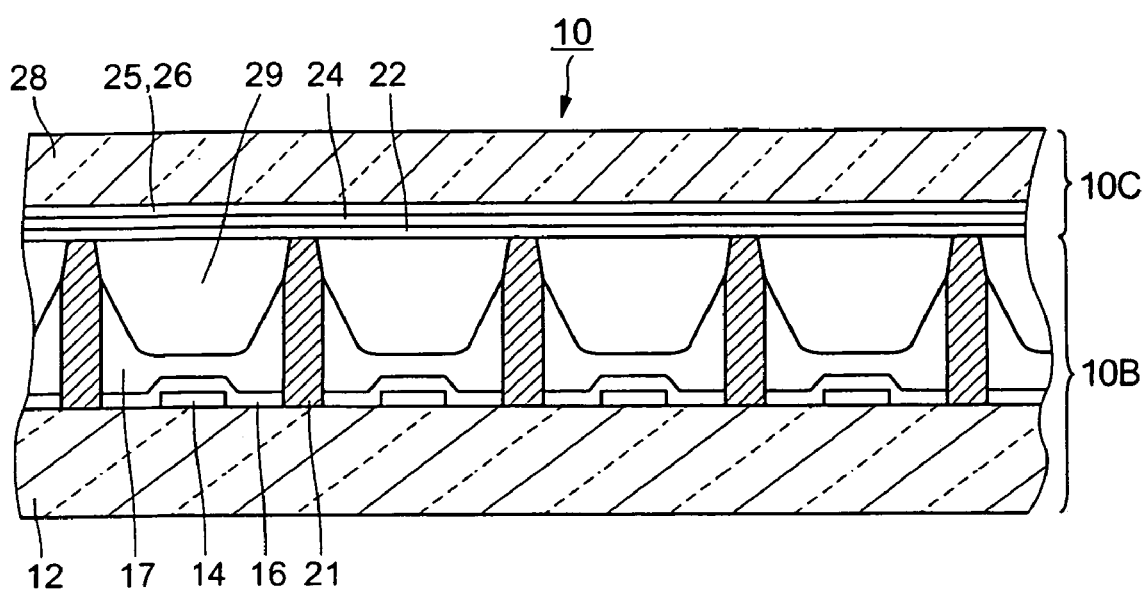
FIG. 9 is a diagram schematically illustrating the plasma display device according to the first embodiment of the invention.

FIG. 9 is a diagram schematically illustrating the plasma display device 10 including the address electrodes 14 manufactured by the manufacturing device 1. The plasma display device 10 includes a back substrate 10B and a front substrate 10C.

The back substrate 10B includes the above-mentioned supporting substrate 12, the plurality of address electrodes 14 formed on the supporting substrate 12 in a stripe like, a dielectric glass layer 16 formed so as to cover the address electrodes 14, and the partition 21 that includes a matrix like shape and defines a plurality of pixel regions.

A fluorescent layer 17 that is capable of emitting light of any of red, green, and blue is applied to a cell surrounded by the partition 21 (namely, the pixel region). The plurality of pixel regions are provided in the matrix like. Each row of the matrix formed by the plurality of pixel regions corresponds to each of the plurality of address electrodes 14.

The front substrate 10C can include a glass substrate 28, a display electrode 25 and a display scanning electrode 26 that the both are patterned on the glass substrate 28 so as to being parallel to each other, the dielectric glass layer 24 formed so as to cover the display electrode 25 and the display scanning electrode 26, and a MgO (magnesium oxide) protection layer 22. The back substrate 10B and the front substrate 10C are aligned such that the address electrode 14 of the back substrate 10B, and the display electrode 25 and the display scanning electrode 26 of the front substrate 10C are perpendicular to each other. A discharge gas 29 is charged into the cell (the pixel region) surrounded by the partition 21 to a prescribed pressure. In FIG. 10, while the bank 20 is removed, the bank 20 may be left in the plasma display device 10.

In this embodiment, while the method for manufacturing the address electrodes 14 of the plasma display device 10 has been described, even if the manufacturing method of the embodiment is applied to another wiring of the plasma display device 10 such as the display electrode 25, the display scanning electrode 26 or the like, the same beneficial effects as those of the described above can be achieved.

A method for manufacturing a liquid crystal display device according to a second embodiment of the invention will be described. As described below, the second embodiment is basically the same as the first embodiment excluding a difference in a shape of the part to be ejected between the first embodiment and the second embodiment.

Figure 10A:
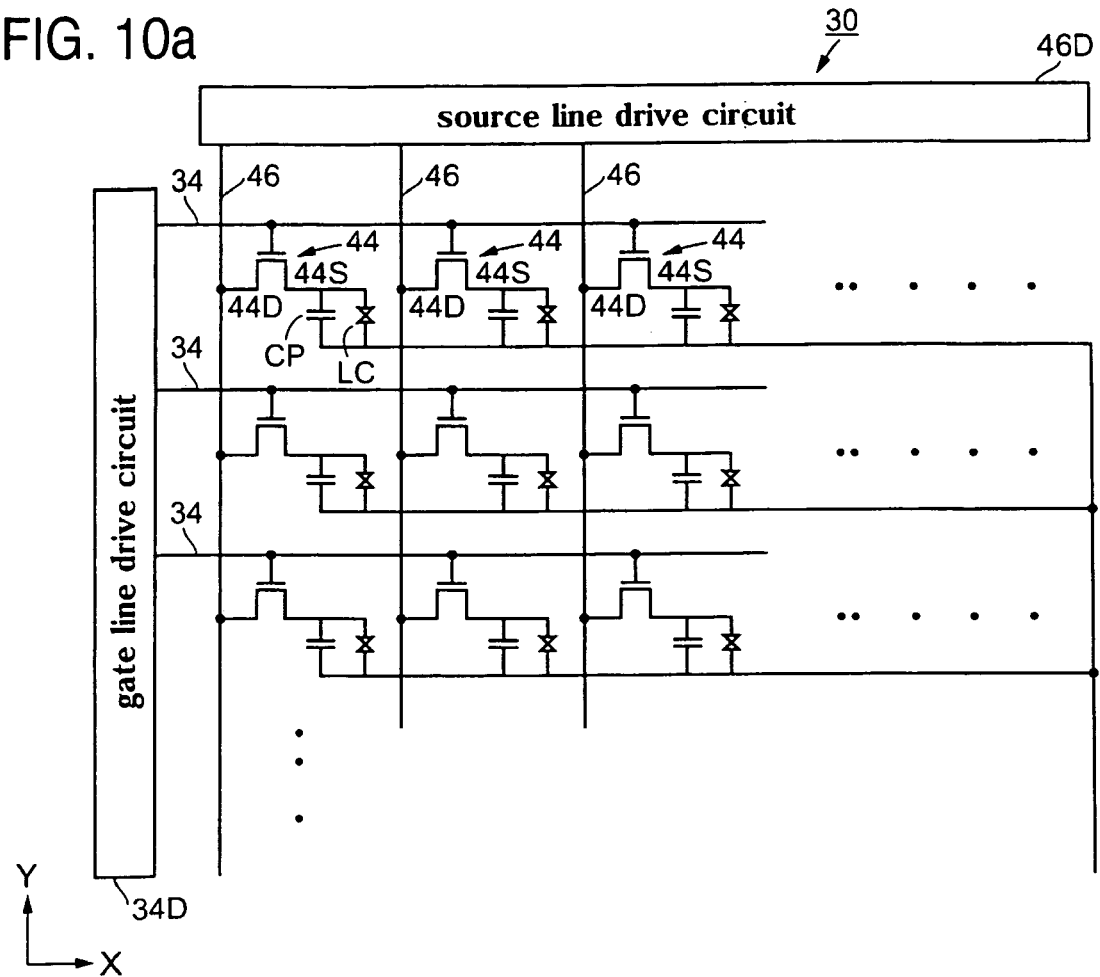
FIG. 10(a) is a diagram schematically illustrating a wiring of a liquid crystal display device and FIG. 10(b) is a diagram schematically illustrating a gate line according to a second embodiment of the invention.

As shown in FIG. 10(a), the liquid crystal display device 30 includes a plurality of gate lines 34 each extending to the X-axis direction, a gate line drive circuit 34D applying a signal to the plurality of gate lines 34, a plurality of source lines 46 each extending to the Y-axis direction, a source line drive circuit 46D applying a signal to the plurality of source lines 46, a plurality of switching elements 44, a plurality of retaining capacitances CP, and a plurality of pixel capacitances LC. The X axis direction and the Y axis direction described here are perpendicular to each other and are the same direction in which the nozzle 118 of the ejecting device 100 relatively moves with respect to the stage as described in the first embodiment. As described below, the plurality of gate lines 34 and the plurality of source lines 46 are provided to an element side substrate of the liquid crystal display device 30. The element side substrate will be described below.

A gate electrode 44G and a drain electrode 44D of each of the switching elements 44 connect in corresponding to at least one of the gate lines 34 and the source lines 46 respectively. A source electrode 44S of each of the switching elements 44 connects both a pixel electrode 36 (FIG. 12) that is a part of the pixel capacitances LC and an electrode that is a part of the retaining capacitances CP.

Figure 10B:
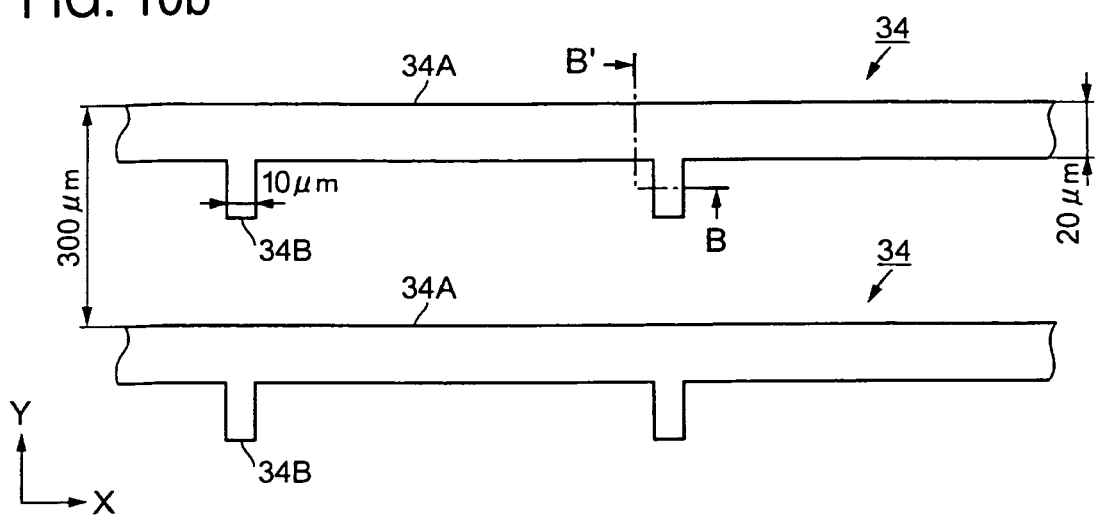

AS shown in FIG. 10(b), a distance between the gate lines 34 is approximately 300 μm. Also, each of the gate lines 34 includes a wide width part 34A and a narrow width part 34B. The width of the wide width part 34A, namely a length in the direction being perpendicular to a longitudinal direction, is longer than that of the narrow width part 34B. The wide width part 34A is the part, which extends to the X-axis direction as the stripe like, of the gate line 34. The width of the wide width part 34A is approximately 20 μm. The narrow width part 34B is the part protruding to the Y-axis direction from the wide width part 34A. Also, it is the gate electrode 44G of the switching element 44. The width of the narrow width part 34B is approximately 10 μm. As described later, the gate line 34 is formed on a part to be ejected 38 (FIG. 11) formed on the base body by ejecting the liquid like wiring material by using the ejecting device such as the inkjet device. Specifically, the gate line 34 is formed by the manufacturing device 1 (FIG. 2) described in the first embodiment.

The gate electrodes 34 in this embodiment are an example of a layer pattern or a wiring of the invention.

Figure 11A:
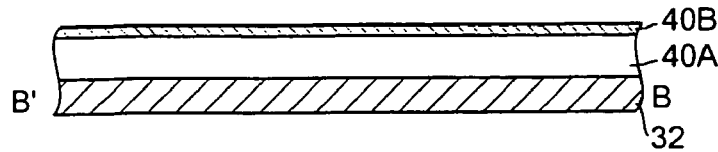
FIGS. 11(a) through (h) are diagrams schematically illustrating a method for manufacturing the gate line according to the second embodiment of the invention.

Next, a method for manufacturing the gate lines 34 will be described. At the first, the supporting substrate 32, such as a glass substrate, is subjected to the UV (ultraviolet) cleaning. Then, as shown in FIG. 11(a), the acrylic-type thermosetting resin in which the black pigment is dispersed (namely resin black) is applied on one surface of the supporting substrate at thickness of approximately 2 μm so as to cover its whole surface by using the spin coating method. Accordingly, a resin black layer 40A forms on the supporting substrate 32. Subsequently, the negative-type acrylic-type chemically amplified photosensitive resist blended with the fluoric-type polymer is applied on the resin black layer 40A so as to cover its whole surface, thereby forming a resist layer 40B on the resin black layer 40A.

Figure 11B:
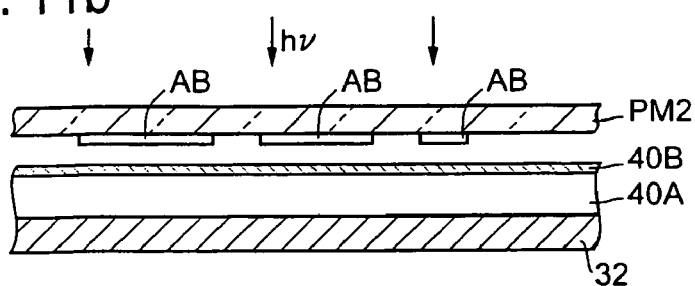
Figure 11C:
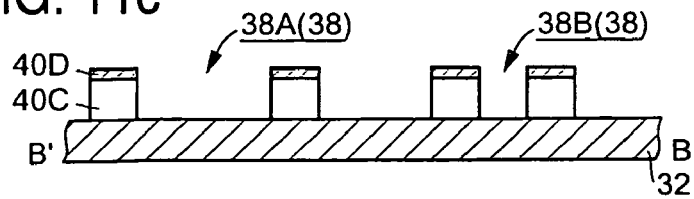

Next, the resist layer 40B and the resin black layer 40A are subjected to the patterning. Specifically, as shown in FIG. 11(b), a photo mask $PM_2$ having the light-shielding part AB at a part corresponding to the region where the address electrode is formed being provided, the resist layer 40B is irradiated by light hv. Then, by performing the etching using the prescribed etchant, the plurality of parts where the light hv has not been irradiated, namely a plurality of parts of the resist layer 40B corresponding to a plurality of gate lines 34, and a resin black layer 40A are removed. Accordingly, the resin black layer 40C and a resist layer 20D having a shape surrounding the gate lines 34 that is to be formed later are formed on the supporting substrate 32.

In this way, by forming the resin black layer 40C located on the supporting substrate 32 and the resist layer 40D located on the resin black layer 40C, a region defined by the resin black layer 40C and the resist layer 40D (namely, the part to be ejected 38) is formed on the supporting substrate 32.

In this embodiment, the resin black layer 40C corresponds to a first layer, and the resist layer 40D corresponds to a second layer in the invention.

In this specification, the resin black layer 40C having the above-mentioned shape and the resist layer 40D located on the resin black layer 40C being combined, it may be described as a bank 40. According to this description, by forming the back 40 including the resin black layer 40C and the resist layer 40D, a region defined by the bank 40, namely the part to be ejected 38, forms on the supporting substrate 32.

Figure 11F:
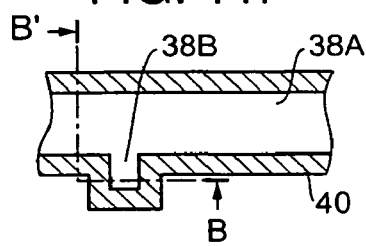
Figure 11D:
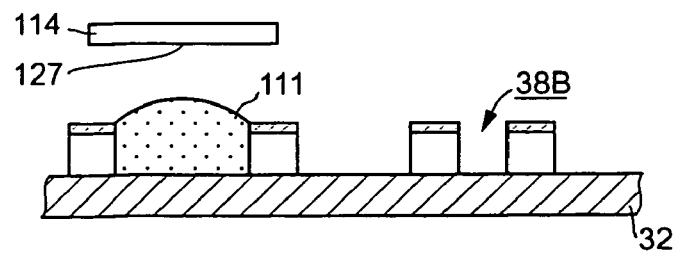
Figure 11G:
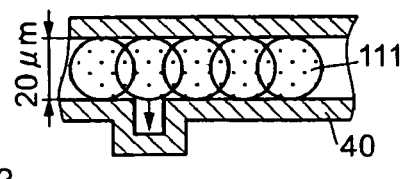
Figure 11E:
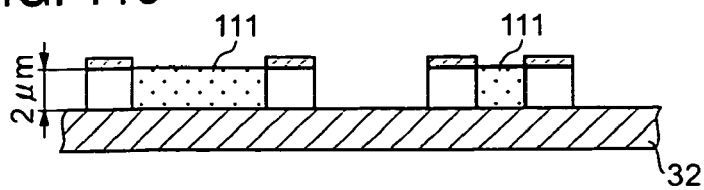
Figure 11H:
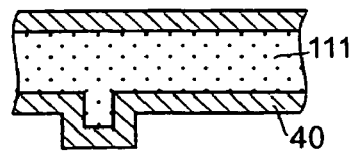

As shown in FIG. 11(f), the part to be ejected 38 has a nearly same shape as that of at least one of the gate lines 34. Therefore, the part to be ejected 38 includes a wide width region 38A corresponding to the wide width part 34A of the gate line 34, and a narrow width region 38B corresponding to the narrow width part 34B of the gate line 34. The width of the wide width region 38A is approximately 20 μm. The width of the narrow width region 38B is approximately 10 μm. In this embodiment, the supporting substrate 32 and the part to be ejected 38 formed on the supporting substrate being combined, it may be described as a base body 30A.

Next, by fixing the base body 30A on the stage 106 of the ejecting device 100 of the manufacturing device 1, the part to be ejected 38 is positioned on the stage 106. In this case, the base body 30A is fixed on the stage 106 such that a longitudinal direction of the part to be ejected 38 is parallel to the Y-axis direction. At least one of the carriage 103 and the stage 106 is moved such that the X-coordinate of the nozzle 118 is identical to the X-coordinate of the part to be ejected 38. In this case, it is preferable that the angle AN between the nozzle row direction HX and the X-axis direction is set such that each X-coordinate of the plurality of nozzles 118 simultaneously coincides with each X-coordinate of the plurality of the parts to be ejected 38. By doing this, the applying scanning for the plurality of parts to be ejected 38 can carry out simultaneously during one scanning period.

The ejecting data applying to the control part 112 of the ejecting device 100 is changed from the data of the first embodiment in accordance with the shape of the part to be ejected 38.

As shown in FIG. 11(*d*) and (*e*), the ejecting device 100 ejects the liquid like wiring material 111 to the part to be ejected 38 from the corresponding nozzle 118 during one scanning period. In this case, as shown in FIG. 11(*d*) and (*g*), the ejecting device 100 ejects the liquid like wiring material 111 to only the wide width region 38A of the part to be ejected 38 at a prescribed interval. If a liquid drop of the wiring material that is just after ejected from the nozzle 118 is projected on the plane defined by the X-axis direction and the Y-axis direction, a radius of the projected liquid drop may be approximately 20 μm. In other words, the radius of the liquid drop is nearly same as the width of the wide width region 38A.

In this embodiment, the resist layer 40D exhibits the lyophobicity to the liquid like wiring material 111.

In addition, the lyophobicity of the resin black layer 40C to the wiring material 111 is lower than that of the resist layer 40D to the wiring material 111. The resin black layer 40C exhibits the lyophilicity rather than the lyophobicity to the wiring material 111. These reasons are that the resist layer 40D is blended with the fluoric-type polymer and the resin black layer 40C does not include the fluoric-type polymer. In general, a surface of the resin including the fluorine exhibits higher lyophobicity to the wiring material including dispersion medium described in the first embodiment than that of the surface of the resin including no fluorine. On the other hand, many resins including no fluorine exhibit the lyophilicity to the above-mentioned liquid like wiring material.

Since the resist layer 40D exhibits relatively high lyophobicity, the liquid drop that just after landed on the part to be ejected 38 flows down to the resin black layer 40C, does not flows out of the part to be ejected 38 beyond the resist layer 40D. Additionally, since a layer being close to the supporting substrate 32, namely the resin black layer 40C, exhibits the lyophilicity, the wiring material landed on the wide width region 38A flows in the narrow width region 38B, even though the wiring material 111 is not ejected to the wide width region 38A. The reason is that the resin black layer 40C causes the capillary phenomenon. In addition, since the bank 40 is made up of a layer exhibiting a desired lyophobicity and a layer exhibiting a desired lyophilicity, the surface treatment process in order to make the bank exhibit the lyophobicity or lyophilicity is not required. For example, the plasma treatment using tetrafluoromethane as the treatment gas or the oxygen plasma treatment is not required.

In this embodiment, the negative-type acrylic-type chemically amplified photosensitive resist blended with the fluoric-type polymer is used as the material for the layer exhibiting the lyophobicity to the liquid like material. It should be understood that photosensitive performance is not limited to the negative-type, a positive-type may be applicable. Also, in this embodiment, the acrylic-type thermosetting resin in which the black pigment is dispersed (namely resin black) is used as the material for the layer exhibiting the lyophilicity to the liquid like material. However, other than the resin black, the photosensitive polyimide, the acrylic-type resist, and the epoxy-type resist can be used as the layer exhibiting the lyophilicity.

Depending on the characteristic of the dispersion medium, the material including no fluoric-type polymer may exhibit the lyophobicity to the wiring material 111 rather than the material including the fluoric-type polymer. In this case, the material can be chosen so as to obtain the desired lyophobicity and lyophilicity according to the dispersion medium included in the wiring material.

As shown in FIG. 11(*e*) and (*h*), the layer of the wiring material is applied not only to the wide width region 38A, but also to the narrow width region 38B by the above-mentioned ejecting method.

If the layer of the wiring material 111 has been formed on all the parts to be ejected 38 of the base body 30A, the transferring device 170 sets the base body 30A in the drying device 150. Then, the gate lines 34 are achieved on the part to be ejected 38 by completely drying the wiring material 111 on the part to be ejected 38. Subsequently, the transferring device 170 sets the base body 30A in the oven 160. Then, the oven 160 reheats (post-baking) the plurality of gate lines 34. A thickness of both the wide width part 34A and the narrow width part 34B after the reheating are approximately 2 μm.

The plurality of gate lines 34 are formed on the base body 30A by the above-mentioned processes. Subsequently, a liquid crystal display device 30 shown in FIG. 12 is achieved from the base body 30A on which the gate lines 34 are formed by utilizing the known thin film forming processes and patterning processes.

Figure 12:
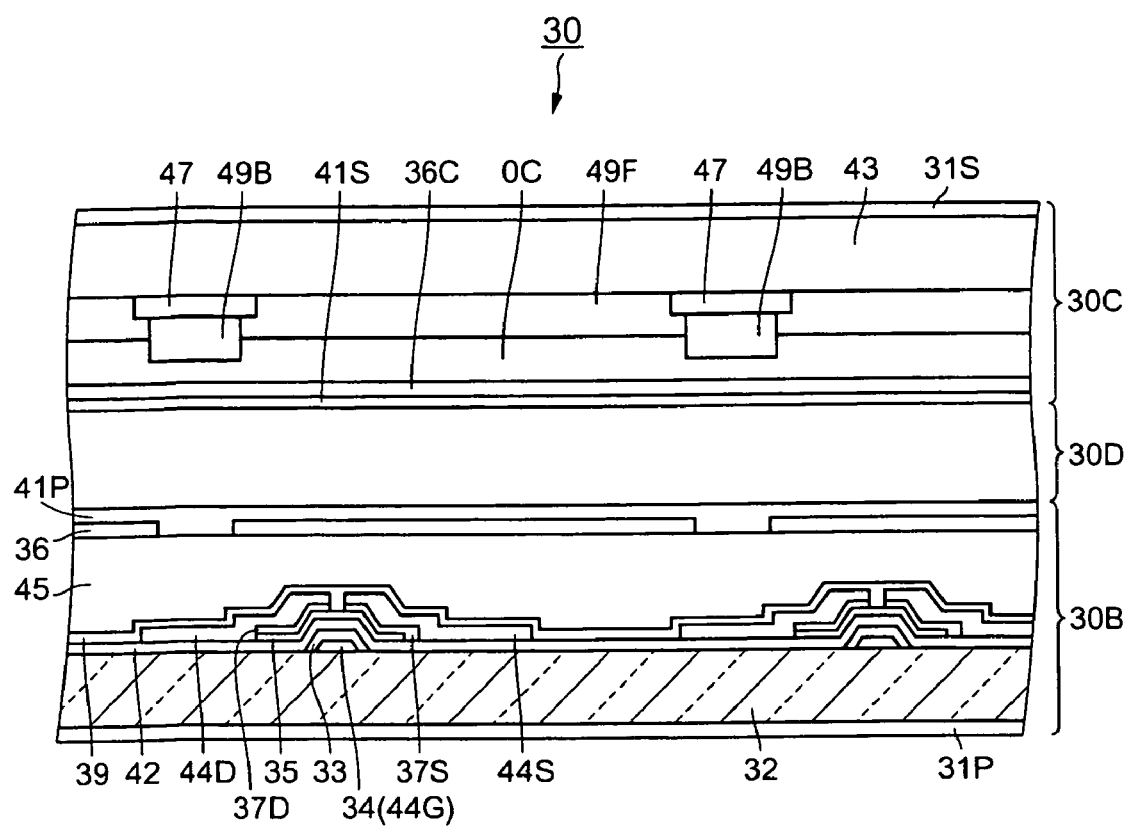
FIG. 12 is a diagram schematically illustrating the liquid crystal display device according to the second embodiment of the invention.

FIG. 12 is a diagram schematically illustrating the liquid crystal display device 30 including the gate lines 34 manufactured by the manufacturing device 1. The liquid crystal display device 30 includes an element side substrate 30B and a front substrate 30C.

The element side substrate 30B can include a polarizing plate 31P provided on a first face of the supporting substrate 32, the plurality of gate lines 34 formed on a second face facing the first face of the supporting substrate 32, an oxide film 33 formed so as to cover the plurality of gate lines 34, a gate insulating film 42 formed so as to cover the oxide film 33 and the supporting substrate 32, and a semiconductor layer 35 formed on the gate insulating film 42 so as to cover the each gate electrode 44G. In addition, the element side substrate 30B can include as follows: a contact layer 37S and a contact layer 37D that both overlap a part of the gate electrode 44G on the corresponding semiconductor layer 35 and are spaced apart a prescribed distance from each other on a region corresponding to the gate electrode 44G; a source electrode 44S formed on the contact layer 37S, a drain electrode 44D formed on the contact layer 37D; at least one of the source lines 46 connecting the drain electrode 44D; a protection film 39 covering the source electrode 44S, the drain electrode 44D, and the source line 46; a interlayer insulating layer 45 such as the polyimide formed on the protection layer 39; the plurality of pixel electrodes 36 arrayed in the matrix like on the interlayer insulating layer 45; and an orientation film 41P covering the plurality of pixel electrodes 36 and the interlayer insulating layer 45. The plurality of pixel electrodes 36 are made of a material having an optical transparency such as ITO (indium-tin oxide). The orientation film 41P is subjected to a rubbing treatment in a prescribed direction. A contact hole (not shown) is provided at a part of the source electrode 44S. At least one of the pixel electrodes 36 connects the source electrode 44S with a conductive film in the contact hole. The gate electrode 44G, the oxide film 33, the semiconductor layer 35, a pair of the contact layer 37S and the contact layer 37D, the source electrode 44S, and the drain electrode 44D are corresponding to each of the switching elements 44 and provided to the each pixel region. Here, each region corresponding to each of the plurality of pixel electrodes 36 is the pixel region.

The front substrate 30C can include as follows: a polarization plate 31S provided on a first face of a substrate 43 such as the glass substrate; a black matrix 47 that is provided on a second face facing the first face of the substrate 43 and includes a plurality of openings each corresponding to the each pixel region; a bank 49B formed on the black matrix 47; a plurality of color filter layers 49F provided to a region divided off by the bank 49B; an over-coating layer OC covering the plurality of color filter layers 49F and the bank 49B; a counter electrode 36C that is formed on the over-coating layer OC and entirely covers the plurality of pixel electrodes 36; and the orientation film 41S covering the counter electrode 36C. The orientation film 41S is subjected to the rubbing treatment in a proper direction. The rubbing direction carrying out for both the orientation film 41P and the orientation film 41S is set so as to align liquid crystal molecules, for example, in TN (twisted nematic) orientation between the orientation film 41P and the orientation film 41S.

A liquid crystal layer 30D is provided between the element side substrate 30B and the front substrate 30C so as to contact the orientation layer 41P and the orientation layer 41S. In FIG. 12, while the bank 40 is removed, the bank 40 may be left in the liquid crystal display device 30.

In this embodiment, while the method for manufacturing the gate lines 34 of the liquid crystal display device 30 has been described, even if the manufacturing method of the embodiment is applied to another wiring of the liquid crystal display device 30 such as the source lines 46, the retaining capacitances wiring or the like, the same beneficial effects as those of the described above can be achieved.

In the first and second exemplary embodiment, the method for manufacturing the plasma display device and liquid crystal display device have been respectively described. More specifically, the method for manufacturing the wiring of the each display device has been described. However, the manufacturing method of the first and second embodiment may be applicable for a method for manufacturing electronic equipment other than the plasma display device and liquid crystal display device. Specifically, in the wiring of electronic equipment, if the above-mentioned manufacturing method is applied to the method for manufacturing the wiring having the wide width part and narrow width part, the same beneficial effects as described in the first and second embodiment can be achieved.

In this specification, electronic equipment is the term includes not only a display device such as an image display device equipped by an electron-emitting device including the plasma display device, the liquid crystal display device, the electroluminescence display device, a FED (field emission display), and a SED (surface-conduction electron-emitter display) but also a IC tag, a radio transmission tag such as a RFID (radio frequency identification) tag or the like and a semiconductor device or the like.

Figure 13A:
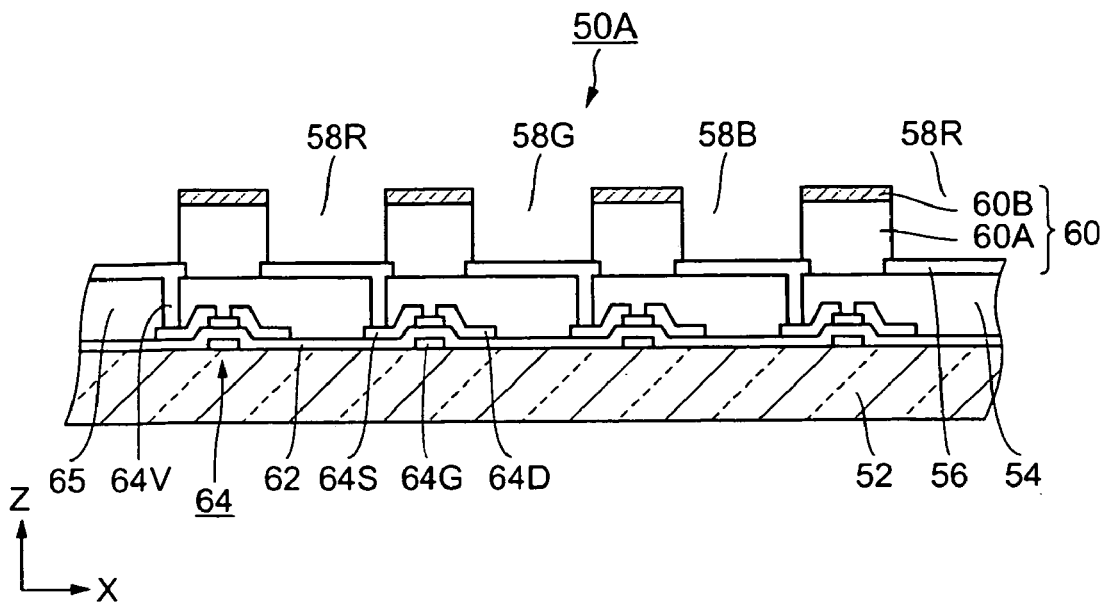
FIG. 13(a) and (b) are respectively sectional and plan view of a base body according to a third embodiment of the invention.

A method for manufacturing the electroluminescence display device according to a third embodiment of the invention will be described. A base body 50A shown in FIG. 13(a) and (b) is the substrate that becomes an electroluminescence display device 50 by processing of a manufacturing device 2 (FIG. 14) described later. The base body 50A includes a plurality of parts to be ejected 58R, 58G, 58B provided in the matrix like.

Specifically, the base body 50A can include a supporting substrate 52, a circuit element layer 54 formed on the supporting substrate 52, a plurality of pixel electrodes 56 formed on the circuit element layer 54, and a bank 60 formed among the plurality of pixel electrodes 56. The supporting substrate 52 is a substrate having the optical transparency to visible light such as the glass substrate for example. Each of the plurality of pixel electrodes 56 is an electrode having the optical transparency to the visible light such as ITO (indium-tin oxide) electrode for example. The plurality of pixel electrodes 56 are provided in the matrix like. Each of them defines the pixel region. The bank 60 has a grid like shape surrounding each of the plurality of pixel electrodes 56. The bank 60 is made up of a resin black layer 60C formed on the circuit element layer 54 and a resist layer 60D formed on the resin black layer 60C.

The circuit element layer 54 can include as follows: a plurality of scanning electrodes extending in a prescribed direction on the supporting substrate 52; an insulating film 62 formed so as to cover the plurality of scanning electrodes; a plurality of signal electrodes formed on the insulating layer 62 and extending in a direction being perpendicular to the direction in which the plurality of scanning electrodes extend; a plurality of switching elements 64 provided in the vicinity of the intersection point of the scanning electrode and signal electrode; and an interlayer insulating layer 65 such as the polyimide or the like formed so as to cover the plurality of switching elements 64. A gate electrode 64G and a drain electrode 64D of each of the switching elements 64 are electrically connected to the corresponding scanning electrode and signal electrode respectively. The plurality of pixel electrodes 56 are formed on the interlayer insulating layer 65. A through hole 64V is provided at the part corresponding to the source electrode 64S of each of the switching elements 64. At least one of the switching elements 64 connects at least one of the corresponding pixel electrode 56 with the conductive film in the through hole 64V. Each of the switching elements 64 is provided at the part corresponding to the bank 60. Thus, observed from the position being perpendicular to FIG. 20(b), each of the plurality of switching elements 64 is located so as to be covered by the bank 60.

A concave part (a part of the pixel region) defined by the pixel electrode 56 and the bank 60 of the base body 50A corresponds to at least one of the parts to be ejected 58R, parts to be ejected 58G, and the parts to be ejected 58B. The part to be ejected 58R is the region where a light-emitting layer 211FR emitting a light ray of wavelength region of the red is to be formed. The part to be ejected 58G is the region where a light-emitting layer 211FG emitting a light ray of wavelength region of the green is to be formed. The part to be ejected 58B is the region where a light-emitting layer 211FB emitting a light ray of wavelength region of the blue is to be formed.

The light-emitting layer 211FR, 211FG, and 211FB of this embodiment are an example of a layer pattern in the invention.

Figure 13B:
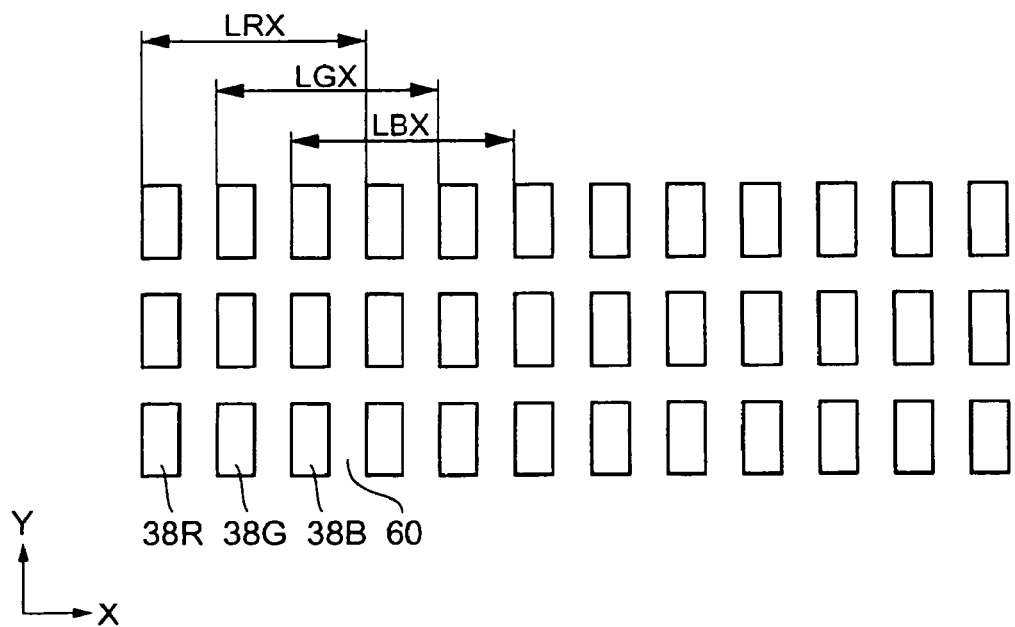

The base body 50A shown in FIG. 13(b) is positioned in parallel to the virtual plane defined by the X-axis direction and the Y-axis direction. A row direction and a column direction of the matrix formed by the plurality of parts to be ejected 58R, 58G, 58B are parallel to the X-axis direction and the Y-axis direction respectively. In the base body 50A, the part to be ejected 58R, the part to be ejected 58G, and the part to be ejected 58B are periodically arranged in the X-axis direction in this order. On the other hand, each of the parts to be ejected 58R is arranged in one line in the Y-axis direction at a prescribed interval. Also, each of the parts to be ejected 58G is arranged in one line in the Y-axis direction at a prescribed interval. Similarly, each of the parts to be ejected 58B are arranged in one line in the Y-axis direction at a prescribed interval.

An interval LRX between the parts to be ejected 58R along the X-axis direction is approximately 560 μm. This interval is the same as an interval LGX between the parts to be ejected 58G along the X-axis direction and also same as an interval LBX between the parts to be ejected 58B along the X-axis direction. The length of the part to be ejected 58R in the X-axis direction is approximately 100 μm. The length of the part to be ejected 58R in the Y-axis direction is approximately 300 μm. The part to be ejected 58G and the part to be ejected 58B are the same size as that of part to be ejected 58R. The above-mentioned interval between the parts to be ejected and the size of the part to be ejected correspond to an interval between pixel regions corresponding to the same color in a high vision television of approximately 40 inches size.

Figure 14:
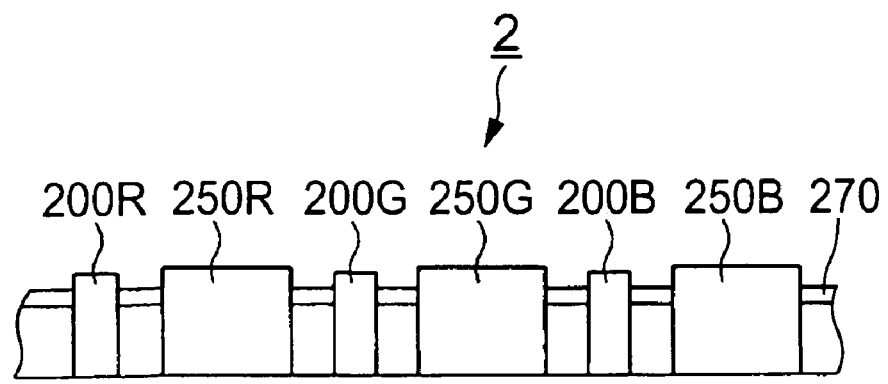
FIG. 14 is a diagram schematically illustrating a manufacturing device according to the third embodiment of the invention.

The manufacturing device 2 shown in FIG. 14 ejects a corresponding light-emitting material to each of the parts to be ejected 58R, 58G, and 58B of the base body 50A shown in FIG. 13. The manufacturing device 2 can include as follows: an ejecting device 200R applying the light-emitting material 211R to all the parts to be ejected 58R; a drying device 250R drying the light-emitting material 211R on the parts to be ejected 58R; an ejecting device 200G applying the light-emitting material 211G to all the parts to be ejected 58G; a drying device 250G drying the light-emitting material 211G on the parts to be ejected 58G; an ejecting device 200B applying the light-emitting material 211B to all the parts to be ejected 58B; and a drying device 250B drying the light-emitting material 211B on the parts to be ejected 58B. In addition, the manufacturing device 2 includes a transferring device 270 transferring the base body 50A in the following order: the ejecting device 200R, the drying device 250R, the ejecting device 200G, the drying device 250G, the ejecting device 200B, and the drying device 250B.

Figure 15:
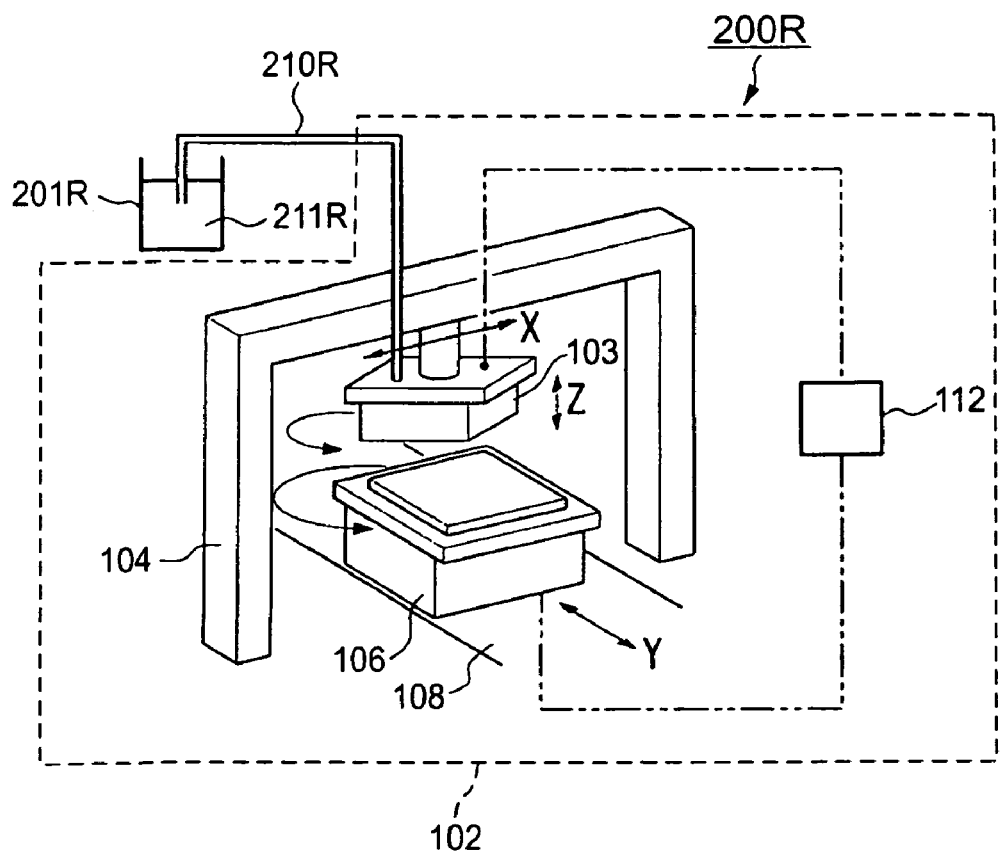
FIG. 15 is a diagram schematically illustrating an ejecting device according to the third embodiment of the invention.
Figure 16A:
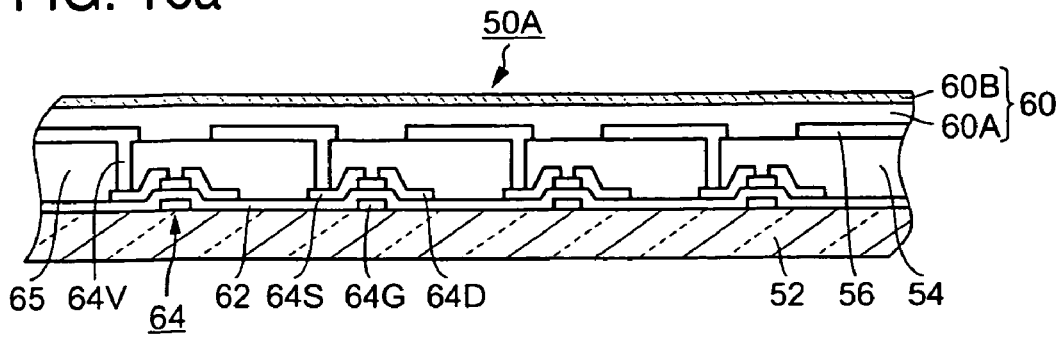
FIGS. 16(a) through (d) are diagrams schematically illustrating a method for manufacturing the gate line according to the third embodiment of the invention.
Figure 16B:
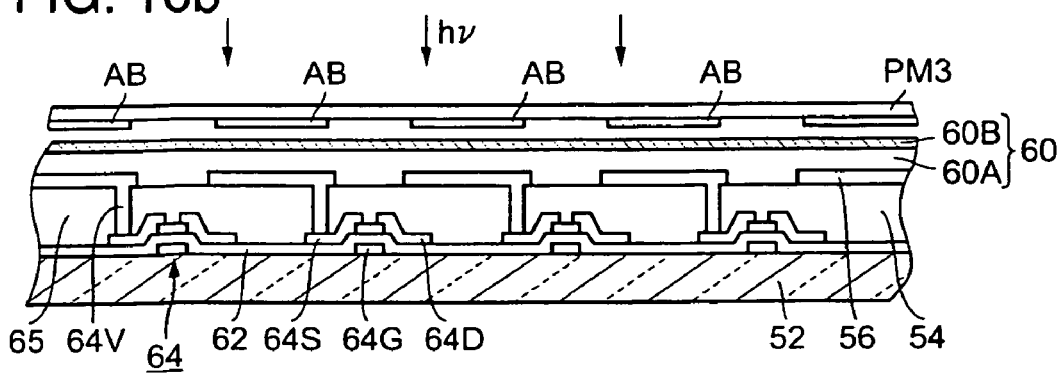
Figure 16C:
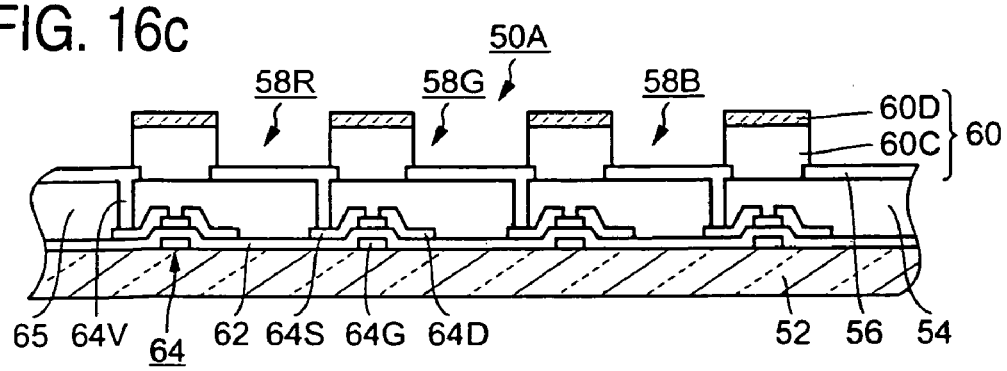
Figure 16D:
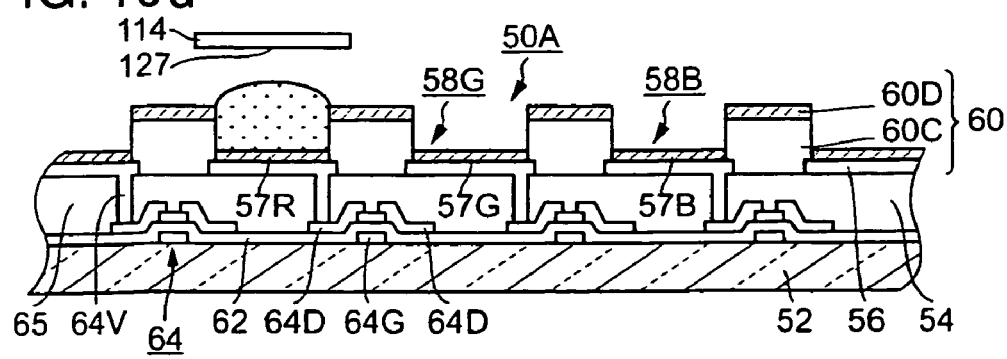

The ejecting device 200R shown in FIG. 15 includes a tank 201R storing the liquid like light-emitting material 211R, an ejecting scanning part 102 to which the light-emitting material 211R is supplied from the tank 201R through a tube 210R. Since the construction of the ejecting scanning part 102 is the same as that of the ejecting scanning part 102 (FIG. 3) of the first embodiment, the same construction element is labeled the same reference number and redundant description is omitted. Also, the construction of both the ejecting device 200G and the ejecting device 200B is basically the same as that of the ejecting device 200R. However, the construction of the ejecting device 200G differs from that of the ejecting device 200R in that the ejecting device 200G includes the tank for the light-emitting material 211G instead of the tank 201R of the ejecting device 200R. Similarly, the construction of the ejecting device 200B differs from that of the ejecting device 200R in that the ejecting device 200B includes the tank for the light-emitting material 211B instead of the tank 201R of the ejecting device 200R.

The method for manufacturing the electroluminescence display device 50 by using the manufacturing device 2 will be described. At the first, the circuit element layer 54 is formed on the supporting substrate 52 by using a known film forming technique and patterning technique. Then, the plurality of pixel electrodes 56 is formed on the circuit element layer 54 in the matrix like.

At the first, the UV cleaning is performed on the circuit element layer 54 and on the pixel electrodes 56. Then, as shown in FIG. 16(*a*), the acrylic-type thermosetting resin in which the black pigment is dispersed (namely, resin black) is applied so as to cover the circuit element layer 54 and the pixel electrodes 56 by using the spin coating method. Accordingly, a resin black layer 60A forms on the circuit element layer 54 and the pixel electrodes 56.

Subsequently, the negative-type acrylic-type chemically amplified photosensitive resist blended with the fluoric-type polymer is applied on the resin black layer 60A so as to cover its whole surface, thereby forming a resist layer 60B on the resin black layer 60A. In this embodiment, a part including the circuit element layer 54 and the pixel electrodes 56 may be described as a circuit substrate.

Next, the resist layer 60B and the resin black layer 60A are subjected to the patterning. Specifically, as shown in FIG. 16(*b*), a photo mask PM3 having a light-shielding part AB at a part corresponding to the region where the light-emitting layer 211FR, 211FG, and 211FB are to be formed being provided, the resist layer 60B is irradiated by light hv. Then, by performing the etching using a prescribed etchant, the plurality of parts where the light hv has not been irradiated, namely the resist layer 60B corresponding to the light-emitting layer 211FR, 211FG, and 211FB, and the corresponding resin black layer 60A are removed. Accordingly, as shown in FIG. 16(*c*), the resin black layer 60C and a resist layer 60D having a shape surrounding the light-emitting layer 211FR, 211FG, and 211FB that are to be formed later are formed on the circuit substrate.

In this way, forming the resin black layer 60C located on the circuit substrate and the resist layer 60D located on the resin black layer 60C, a region defined by the resin black layer 60C and the resist layer 60D (namely, the part to be ejected 58R, 58G, 58B) is formed on the above-mentioned substrate. In this embodiment, the resin black layer 60C corresponds to a first layer, and the resist layer 60D corresponds to a second layer in the invention.

In this specification, the resin black layer 60C having the above-mentioned shape and the resist layer 60D located on the resin black layer 60C being combined, it may be described as a bank 60. According to this description, by forming the back 60 including the resin black layer 60C and the resist layer 60D, a region defined by the bank 60, namely the part to be ejected 58R, 58G, 58B, forms on the circuit substrate.

On the pixel electrode 56 of the part to be ejected 58R, 58G, and 58B, a corresponding hole-transporting layer 57R, 57G, and 57B may be formed. If the hole-transporting layer 57R, 57G, and 57B are located among the pixel electrode 56 and the light-emitting layer 211RF, 211GF, and 211GF, a light-emitting efficiency of the electroluminescence display device increases. In the case where the hole-transporting layer 57R, 57G, and 57B are formed on the pixel electrode 56, a concave part defined by the hole-transporting layer 57R, 57G, 57B, and the bank 60 corresponds to the part to be ejected 58R, 58G, and 58B.

The hole-transporting layer 57R, 57G, 57B can be formed by the inkjet method. The hole-transporting layer 57R, 57G, 57B may be formed on the part to be ejected 58R, 58G, 58B. In this case, a liquid including materials for forming the hole-transporting layer 57R, 57G, 57B is applied to the each pixel region by a prescribed amount. Then, the hole-transporting layer 57R, 57G, 57B can be formed by drying them.

The base body 50A including the part to be ejected 58R, 58G, 58B is transferred to the stage 106 by the transferring device 270. Then, as shown in FIG. 16(*d*), the ejecting device 200R ejects the light-emitting material 211R from the head 114 such that the light-emitting layer 211R is formed to all the parts to be ejected 58R. If the light-emitting material 211R is formed on all the parts to be ejected 58R of the base body 50A, the transferring device 270 sets the base body 50A in the drying device 250R. Then, the light-emitting layer 211R is achieved on the part to be ejected 58R by completely drying the light-emitting layer 211R on the part to be ejected 58R.

Next, the transferring device 270 transfers the base body 50A to the stage 106 of the ejecting device 200G. Then, the ejecting device 200G ejects the light-emitting material 211G from the head 114 such that the light-emitting layer 211G is formed to all the parts to be ejected 58G. If the light-emitting material 211G is formed on all the parts to be ejected 58G of the base body 50A, the transferring device 270 sets the base body 50A in the drying device 250G. Then, the light-emitting layer 211G is achieved on the part to be ejected 58G by completely drying the light-emitting layer 211G on the part to be ejected 58G.

Next, the transferring device 270 transfers the base body 50A to the stage 106 of the ejecting device 200B. Then, the ejecting device 200B ejects the light-emitting material 211B from the head 114 such that the light-emitting layer 211B is formed to all the parts to be ejected 58B. If the light-emitting material 211B is formed on all the parts to be ejected 58B of the base body 50A, the transferring device 270 sets the base body 50A in the drying device 250B. Then, the light-emitting layer 2111B is achieved on the part to be ejected 58B by completely drying the light-emitting layer 211B on the part to be ejected 58B.

In this embodiment, the resist layer 60D exhibits the t lyophobicity o the liquid like light-emitting material 211R, 211G, 211B. In addition, the lyophobicity of the resin black layer 60C to the liquid like light-emitting material 211R, 211G, 211B is lower than that of the resist layer 60D to the liquid like light-emitting material 211R, 211G, 211B. The resin black layer 60C exhibits the lyophilicity rather than the lyophobicity to the liquid like light-emitting material 211R, 211G, 211B. These reasons are that the resist layer 60D is blended with the fluoric-type polymer and the resin black layer 60C does not include the fluoric-type polymer. In general, a surface of the resin including fluorine exhibits higher lyophobicity to the wiring material including the dispersion medium described above than that of the surface of the resin including no fluorine. On the other hand, many resins including no fluorine exhibit the lyophilicity to the above-mentioned liquid like wiring material.

Since the resist layer 60D exhibits relatively high lyophobicity, the liquid drop of the light-emitting material that just after landed on the part to be ejected 58R, 58G, 58B flows down to the resin black layer 60C, does not flows out of the part to be ejected 58R, 58G, 58B beyond the resist layer 60D. In addition, since the bank 60 is made up of a layer exhibiting the desired lyophobicity and a layer exhibiting the desired lyophilicity, the surface treatment process in order to make the bank exhibit the lyophobicity or lyophilicity is not required. For example, the plasma treatment using tetrafluoromethane as the treatment gas or the oxygen plasma treatment is not required.

Figure 17:
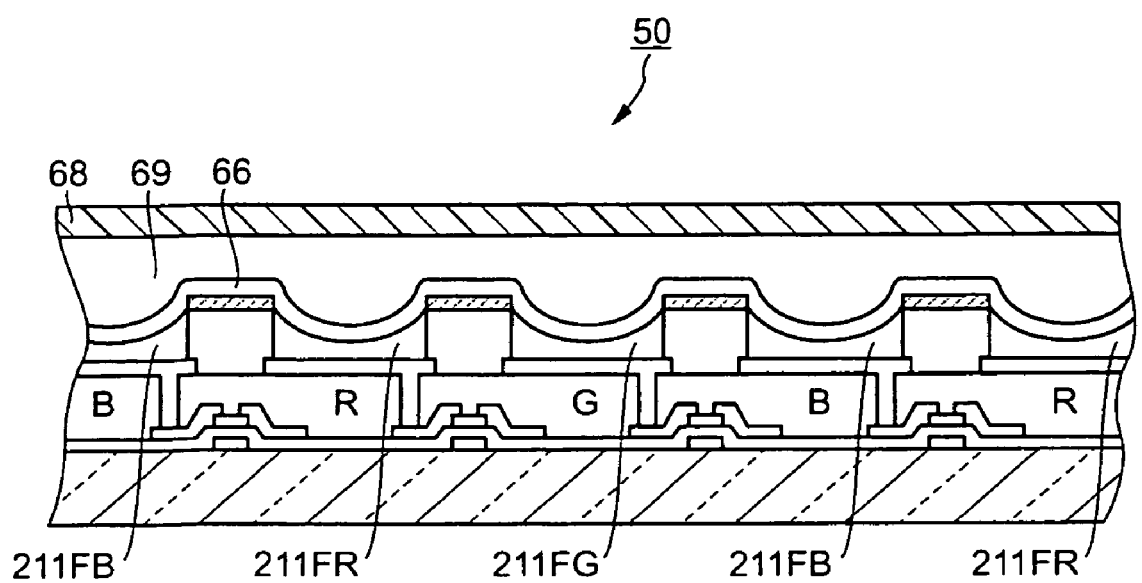
FIG. 17 is a diagram schematically illustrating an electroluminescence display device of the third embodiment.

Next, as shown in FIG. 17, a counter electrode 66 is formed so as to cover the light-emitting layer 211FR, 211FG, 211FB and the bank 60. The counter electrode 66 functions as a cathode. Subsequently, a sealing plate 68 and the base body 50A are bonded at each peripheral part, thereby achieving the electroluminescence display device 50 shown in FIG. 17. An inert gas 69 is filled between the sealing plate 68 and the base body 50A.

In the electroluminescence display device 50, the light emitted from the light-emitting layer 211FR, 211FG, and 211FB is exited after traveling through the pixel electrode 56, the circuit element layer 54, and the supporting substrate 52. Such electroluminescence display device exciting light through the circuit element layer is called a bottom emission type display device.

In the above-mentioned embodiments, while a partition constructed by the stacked layers of the first layer and the second layer has been exemplified, it is possible to form with only the first layer. A construction similar to any construction of the above-mentioned first through third embodiment can be achieved by controlling the degree of the lyophobicity/lyophilicity of the partition formed with only the first layer. For example, the above-mentioned construction can be achieved by the lyophobicity treatment such that a lower layer part of the partition exhibits high lyophilicity and an upper layer part of the partition exhibits higher lyophobicity than that of the lower layer part. Accordingly, even if the partition is formed with one layer, the liquid drop applied on the wide width region soaks the narrow wide region, thereby enabling the narrow line width region to fill with the liquid. The above-mentioned materials can be used for the partition.

In addition, in the case where a wide line width region is required to be applied with the liquid, dropping a plurality of liquid drops in a line width direction can plot a region. Using such plotting method, the liquid can be applied to the region where the line width is wide and can fill it in short order. Since the region where the line width is wide is filled in short order, the region where the line width is narrow also can be filled with the liquid in short order.

If a film is required to form thick, the above-mentioned plotting can be carried out several times. Specifically, the plotting shown in FIG. 8(g), for example, is carried out several times. Additionally, the above-mentioned plotting method that the plurality of liquid drops are dropped in the line width direction can be carried out several times.

The above-mentioned plotting method is applicable to any of the above-mentioned exemplary embodiments 1 through 3.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method for manufacturing a layer pattern, comprising:
    a) forming a region defined by a first layer and a second layer on a substrate, the first layer being formed on the substrate and the second layer being located on the first layer, and forming the first layer and the second layer such that the region includes a first part having a first width and a second part having a second width that is narrower than the first width; and
    b) ejecting a liquid like member only to the first part of the region from an ejecting part of an ejecting device, lyophobicity of the first layer with respect to the liquid like member being lower than lyophobicity of the second layer with respect to the liquid like member.

2. The method for manufacturing a layer pattern according to claim 1, the first layer having lyophilicity with respect to the liquid like member.

3. A method for manufacturing a wiring, comprising:
   a) forming a region defined by a first layer and a second layer on a substrate, the first layer being formed on the substrate and the second layer being located on the first layer, and forming the first layer and the second layer such that the region includes a first part having a first width and a second part having a second width that is narrower than the first width; and
   b) ejecting a liquid like wiring member only to the first part of the region from an ejecting part of an ejecting device, lyophobicity of the first layer with respect to the liquid like wiring member being lower than lyophobicity of the second layer with respect to the liquid like wiring member.

4. The method for manufacturing a wiring according to claim 3 the first layer having lyophilicity with respect to the liquid like wiring member.

5. A method for manufacturing electronic equipment, comprising:
   a) forming a region defined by a first layer and a second layer on a substrate, the first layer being formed on the substrate and the second layer being located on the first layer, and forming the first layer and the second layer such that the region includes a first part having a first width and a second part having a second width that is narrower than the first width; and
   b) ejecting a liquid like member only to the first part of the region from an ejecting part of an ejecting device, lyophobicity of the first layer with respect to the liquid like member being lower than lyophobicity of the second layer with respect to the liquid like member.

6. The method for manufacturing electronic equipment according to claim 5, the first layer having lyophilicity with respect to the liquid like member.

* * * * *